US012598748B2

(12) United States Patent
Wu et al.

(10) Patent No.: US 12,598,748 B2
(45) Date of Patent: Apr. 7, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Linchun Wu, Wuhan (CN); Shuangshuang Wu, Wuhan (CN); Lei Li, Wuhan (CN); Kun Zhang, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 715 days.

(21) Appl. No.: 17/983,570

(22) Filed: Nov. 9, 2022

(65) Prior Publication Data

US 2024/0098994 A1     Mar. 21, 2024

(30) Foreign Application Priority Data

Sep. 15, 2022  (CN) ......................... 202211124065.8
Sep. 15, 2022  (CN) ......................... 202211124454.0

(51) Int. Cl.
*H10B 43/27*          (2023.01)
(52) U.S. Cl.
CPC ................................... *H10B 43/27* (2023.02)
(58) Field of Classification Search
CPC ............................... H10B 41/27; H10B 43/27
See application file for complete search history.

(56) References Cited

U.S. PATENT DOCUMENTS

| | | | |
|---|---|---|---|
| 11,715,666 B2 * | 8/2023 | Im ...................... | H10D 84/0188 257/288 |
| 2011/0281379 A1 * | 11/2011 | Yang ...................... | H10B 43/40 257/E21.21 |
| 2015/0380419 A1 * | 12/2015 | Gunji-Yoneoka ........................... | H01L 21/31111 438/594 |
| 2018/0033799 A1 * | 2/2018 | Kanamori .............. | H10B 43/27 |
| 2022/0123015 A1 * | 4/2022 | Na .......................... | H10B 43/10 |
| 2023/0056340 A1 * | 2/2023 | Wu ......................... | H10B 41/27 |
| 2023/0225124 A1 * | 7/2023 | Wu ......................... | H10B 43/20 257/329 |
| 2024/0064977 A1 * | 2/2024 | Li .......................... | H10B 41/27 |

FOREIGN PATENT DOCUMENTS

| | | | | | |
|---|---|---|---|---|---|
| CN | 111627918 A | * | 9/2020 | ............. | H10B 43/35 |
| CN | 114664850 A | * | 6/2022 | ............. | H01L 25/18 |

* cited by examiner

*Primary Examiner* — Evren Seven
(74) *Attorney, Agent, or Firm* — BAYES PLLC

(57) ABSTRACT

A three-dimensional (3D) memory device includes a stack structure including interleaved first conductive layers and first dielectric layers, and a channel structure extending through the stack structure along a first direction in contact with a first semiconductor layer at a bottom portion of the channel structure. The channel structure includes a semiconductor channel, and a memory film over the semiconductor channel. The semiconductor channel includes an angled structure, and a first width of the semiconductor channel at the bottom portion of the channel structure below the angled structure is smaller than a second width of the semiconductor channel at an upper portion of the channel structure above the angled structure.

20 Claims, 19 Drawing Sheets

100

<u>1700</u>

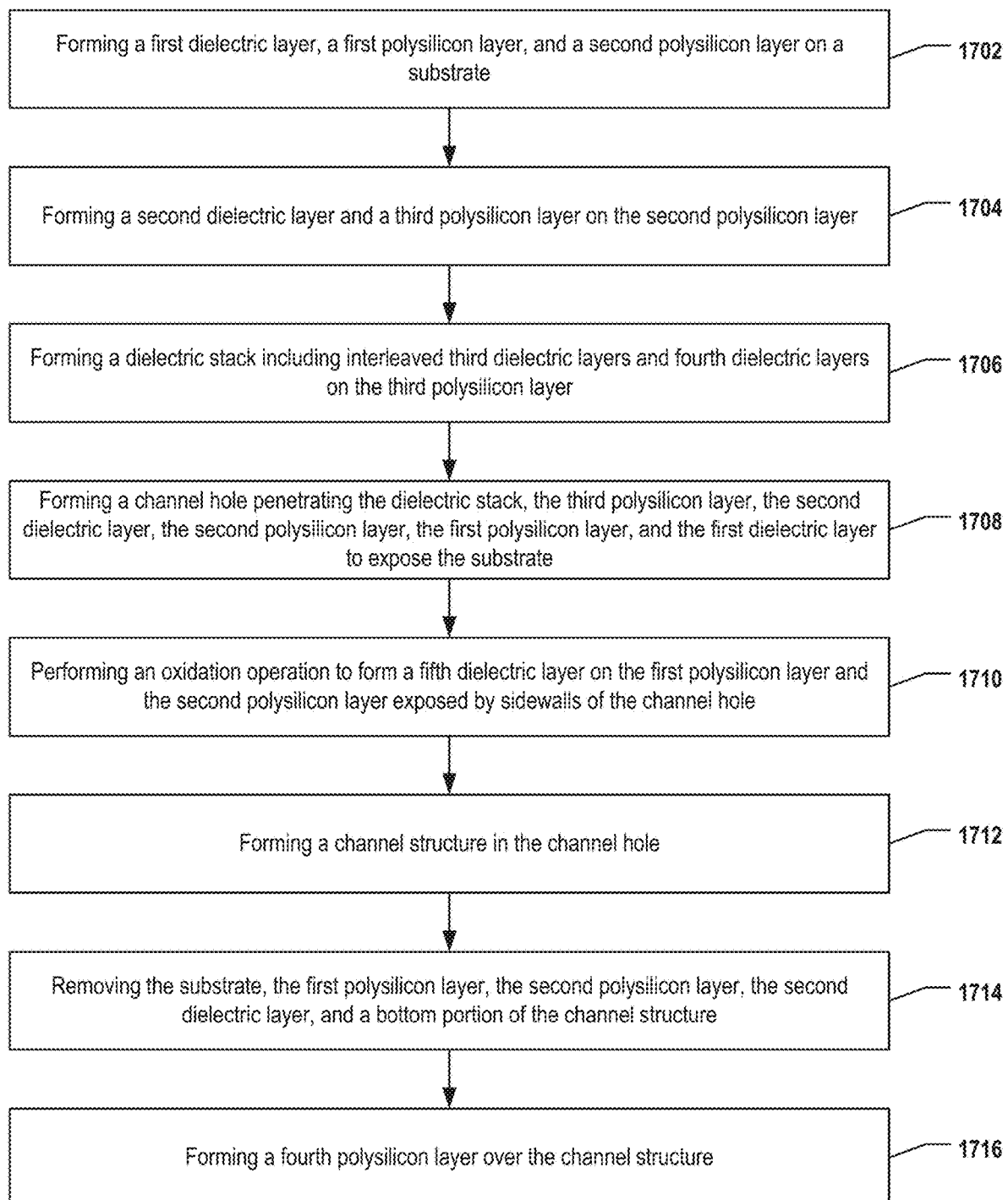

Forming a first dielectric layer, a first polysilicon layer, and a second polysilicon layer on a substrate — 1702

Forming a second dielectric layer and a third polysilicon layer on the second polysilicon layer — 1704

Forming a dielectric stack including interleaved third dielectric layers and fourth dielectric layers on the third polysilicon layer — 1706

Forming a channel hole penetrating the dielectric stack, the third polysilicon layer, the second dielectric layer, the second polysilicon layer, the first polysilicon layer, and the first dielectric layer to expose the substrate — 1708

Performing an oxidation operation to form a fifth dielectric layer on the first polysilicon layer and the second polysilicon layer exposed by sidewalls of the channel hole — 1710

Forming a channel structure in the channel hole — 1712

Removing the substrate, the first polysilicon layer, the second polysilicon layer, the second dielectric layer, and a bottom portion of the channel structure — 1714

Forming a fourth polysilicon layer over the channel structure — 1716

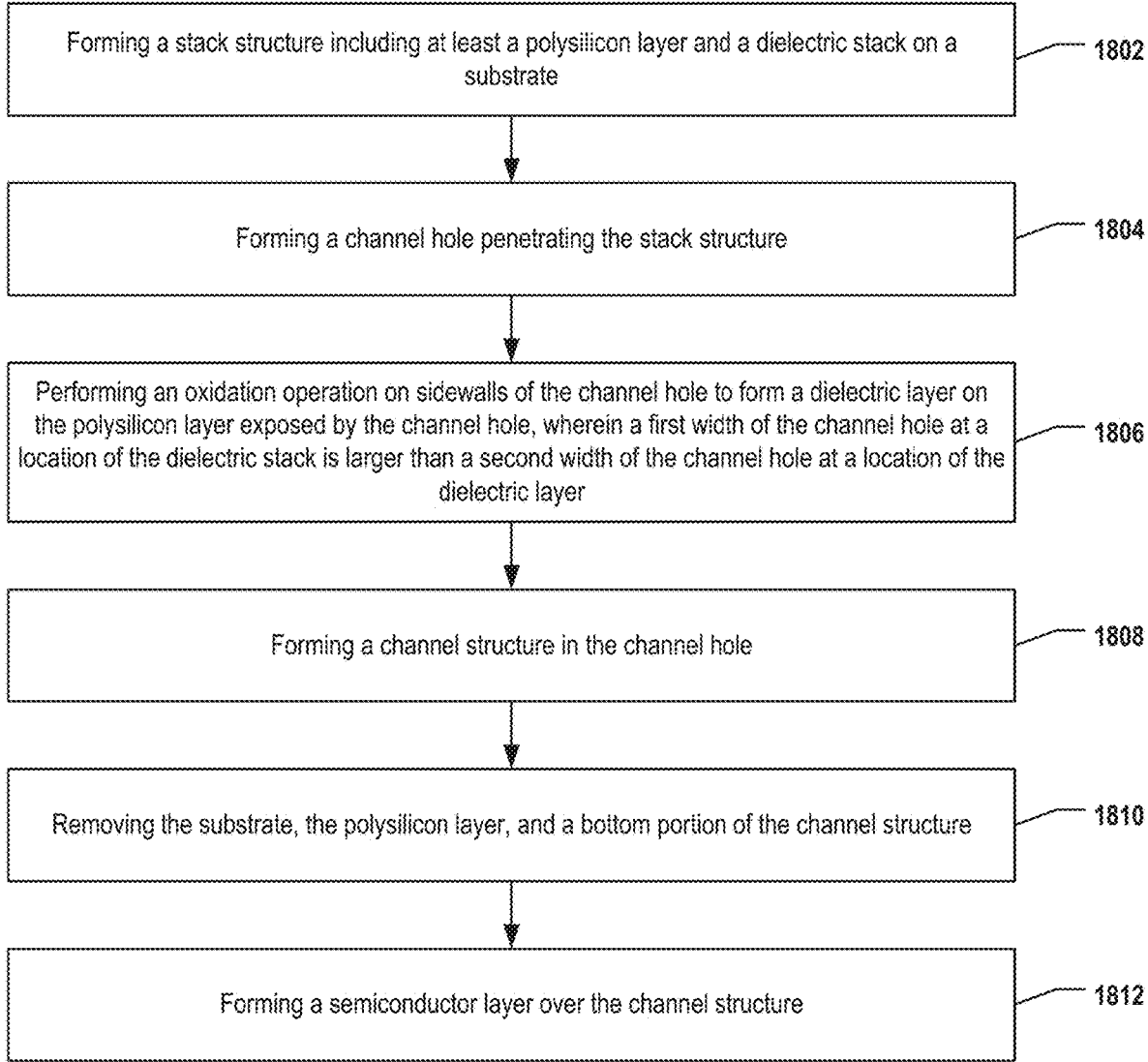

Forming a stack structure including at least a polysilicon layer and a dielectric stack on a substrate — 1802

Forming a channel hole penetrating the stack structure — 1804

Performing an oxidation operation on sidewalls of the channel hole to form a dielectric layer on the polysilicon layer exposed by the channel hole, wherein a first width of the channel hole at a location of the dielectric stack is larger than a second width of the channel hole at a location of the dielectric layer — 1806

Forming a channel structure in the channel hole — 1808

Removing the substrate, the polysilicon layer, and a bottom portion of the channel structure — 1810

Forming a semiconductor layer over the channel structure — 1812

FIG. 18

1900
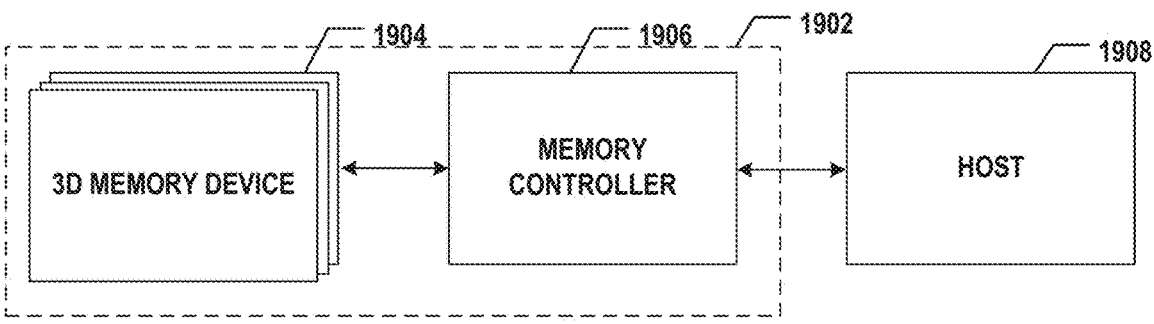
FIG. 19
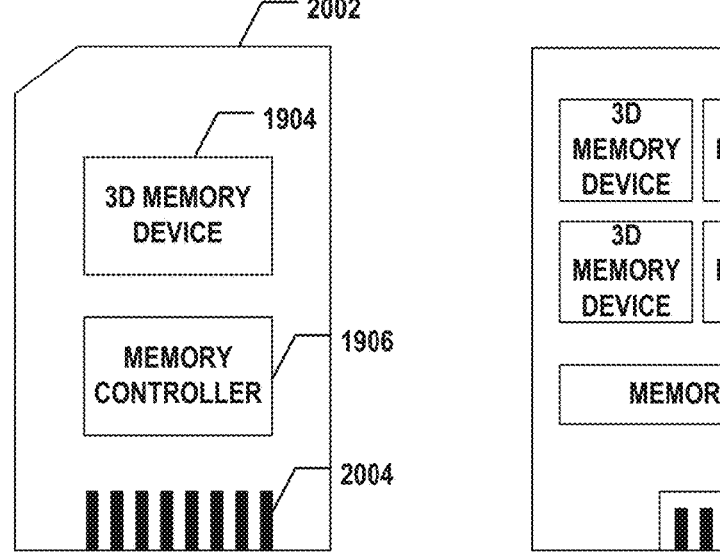
FIG. 20A                    FIG. 20B

THREE-DIMENSIONAL MEMORY DEVICES AND METHODS FOR FORMING THE SAME

CROSS-REFERENCES TO RELATED APPLICATIONS

This application claims the benefit of priorities to Chinese Application No. 202211124454.0, filed on Sep. 15, 2022, and Chinese Application No. 202211124065.8, filed on Sep. 15, 2022, both of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. As the number of 3D memory layers continues to increase, the control of channel profile becomes more and more difficult.

SUMMARY

Embodiments of 3D memory devices and methods for forming the same are disclosed herein.

In one aspect, a 3D memory device is disclosed. The 3D memory device includes a stack structure including interleaved first conductive layers and first dielectric layers, and a channel structure extending through the stack structure along a first direction in contact with a first semiconductor layer at a bottom portion of the channel structure. The channel structure includes a semiconductor channel, and a memory film over the semiconductor channel. The semiconductor channel includes an angled structure, and a first width of the semiconductor channel at the bottom portion of the channel structure below the angled structure is smaller than a second width of the semiconductor channel at an upper portion of the channel structure above the angled structure.

In some implementations, the 3D memory device further includes a second semiconductor layer under the stack structure. The first semiconductor layer is under the second semiconductor layer, and the first semiconductor layer is in contact with the channel structure.

In some implementations, the second semiconductor layer includes an undoped polysilicon layer, and the first semiconductor layer includes a polysilicon layer.

In some implementations, the 3D memory device further includes a second dielectric layer between the second semiconductor layer and the channel structure. The second dielectric layer insulates the channel structure and the second semiconductor layer, and a top surface of the second semiconductor layer is ammonia ($NH_3$) treated.

In another aspect, a method for forming a 3D memory device is disclosed. A first dielectric layer, a first polysilicon layer, and a second polysilicon layer are formed on a substrate. A second dielectric layer and a third polysilicon layer are formed on the second polysilicon layer. A dielectric stack including interleaved third dielectric layers and fourth dielectric layers is formed on the third polysilicon layer. A channel hole penetrating the dielectric stack, the third polysilicon layer, the second dielectric layer, the second polysilicon layer, the first polysilicon layer, and the first dielectric layer is formed to expose the substrate. An oxidation operation is performed to form a fifth dielectric layer on the first polysilicon layer and the second polysilicon layer exposed by sidewalls of the channel hole. A channel structure is formed in the channel hole. The substrate, the first polysilicon layer, the second polysilicon layer, the second dielectric layer, and a bottom portion of the channel structure are removed. A fourth polysilicon layer is formed over the channel structure.

In some implementations, the first dielectric layer is formed on the substrate, an undoped polysilicon layer or a carbon-doping polysilicon layer is formed on the first dielectric layer as the first polysilicon layer, and a p-type doping polysilicon layer is formed on the undoped polysilicon layer or the carbon-doping polysilicon layer as the second polysilicon layer. The first polysilicon layer and the second polysilicon layer are formed in a same deposition operation.

In some implementations, an ammonia ($NH_3$) treatment is performed on the second polysilicon layer.

In some implementations, the second dielectric layer is formed on the second polysilicon layer, and an undoped polysilicon layer is formed on the second dielectric layer.

In some implementations, an $NH_3$ treatment is performed on the third polysilicon layer.

In some implementations, a wet oxidation operation is performed on the sidewalls of the channel hole.

In some implementations, the fifth dielectric layer is formed on the first polysilicon layer and the second polysilicon layer exposed by the sidewalls of the channel hole, and a sixth dielectric layer is formed on the third polysilicon layer exposed by the sidewalls of the channel hole.

In some implementations, a first oxidation rate of the oxidation operation on the first polysilicon layer is lower than a second oxidation rate of the oxidation operation on the second polysilicon layer.

In some implementations, a third oxidation rate of the oxidation operation on the third polysilicon layer is lower than the second oxidation rate of the oxidation operation on the second polysilicon layer.

In some implementations, after performing the oxidation operation, the channel hole includes a first width at a location of the dielectric stack and a second width at a location of the second polysilicon layer, and the first width is larger than the second width.

In some implementations, the second width is less than 40 nanometers.

In some implementations, a memory film is formed over the sidewalls of the channel hole, and a semiconductor channel is formed over the memory film above the second polysilicon layer.

In still another aspect, a method for forming a 3D memory device is disclosed. A stack structure including at least a polysilicon layer and a dielectric stack is formed on a substrate. A channel hole penetrating the stack structure is formed. An oxidation operation is performed on sidewalls of the channel hole to form a dielectric layer on the polysilicon layer exposed by the channel hole. A first width of the channel hole at a location of the dielectric stack is larger than a second width of the channel hole at a location of the dielectric layer. A channel structure is formed in the channel hole. The substrate, the polysilicon layer, and a bottom portion of the channel structure are removed. A semiconductor layer is formed over the channel structure.

In some implementations, a p-doping polysilicon layer is formed on the substrate, and an NH3 treatment is performed on the p-doped polysilicon layer.

In some implementations, a wet oxidation operation is performed on sidewalls of the channel hole.

In some implementations, a memory film is formed over the sidewalls of the channel hole, and a semiconductor channel is formed over the memory film above the polysilicon layer.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 17 illustrates a flowchart of an exemplary method for forming a 3D memory device, according to some aspects of the present disclosure.

FIG. 18 illustrates a flowchart of an exemplary method for forming a 3D memory device, according to some aspects of the present disclosure.

FIG. 19 illustrates a block diagram of an exemplary system having a memory device, according to some aspects of the present disclosure.

FIG. 20A illustrates a diagram of an exemplary memory card having a memory device, according to some aspects of the present disclosure.

FIG. 20B illustrates a diagram of an exemplary solid-state drive (SSD) having a memory device, according to some aspects of the present disclosure.

Figure 1:
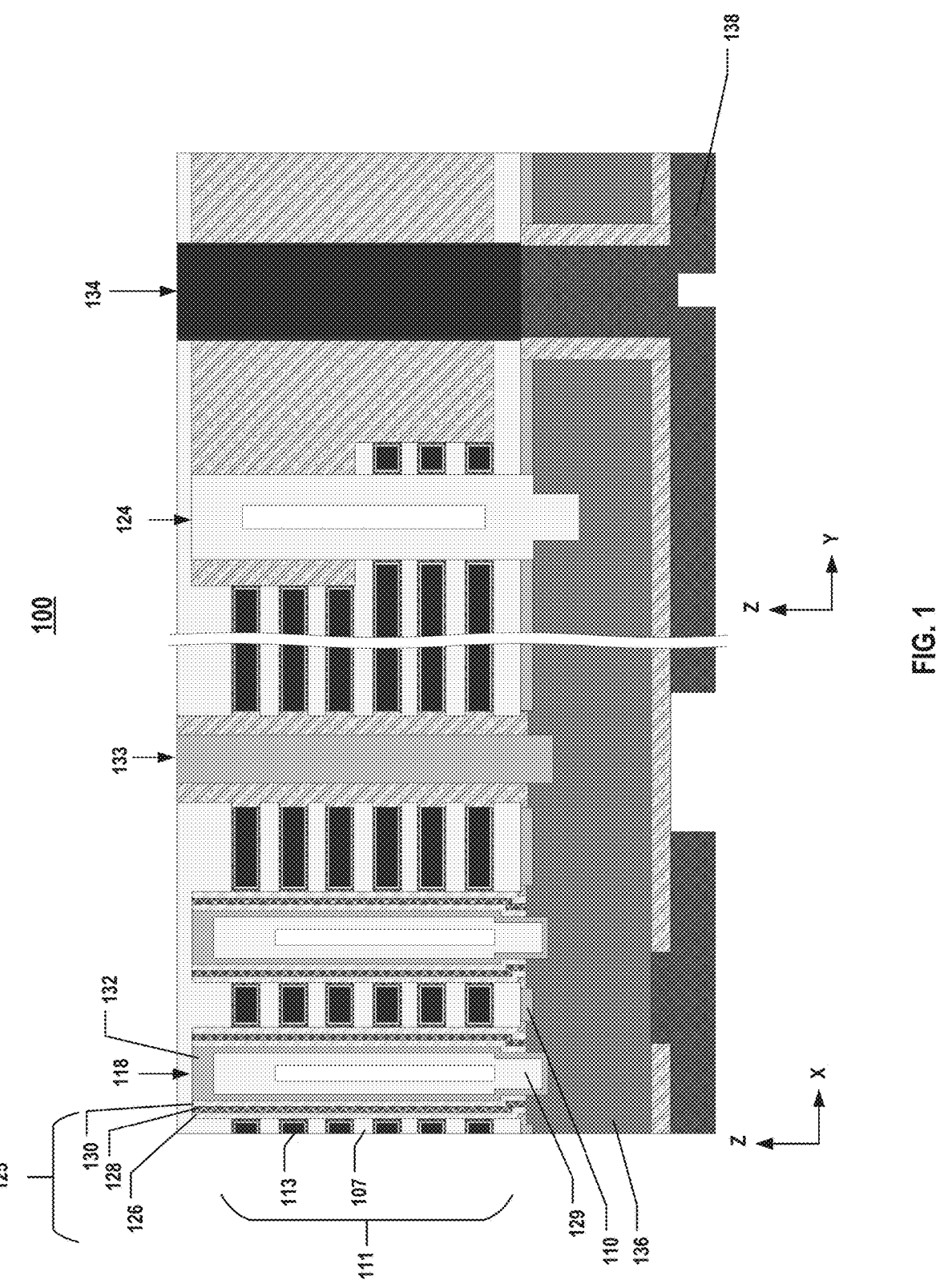
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductor device can be formed by stacking semiconductor wafers or dies and interconnecting them vertically so that the resulting structure acts as a single device to achieve performance improvements at reduced power and a smaller footprint than conventional planar processes. However, as the number of 3D memory layers continues to increase, the control of channel profile becomes more and more difficult FIG. 1 illustrates a cross-section of an exemplary 3D memory device 100, according to some aspects of the present disclosure. As shown in FIG. 1, 3D memory device 100 includes a stack structure 111 and a channel structure 118 extending through stack structure 111 along the z-direction. In some implementations, channel structure 118 extends vertically through stack structure 111 along the z-direction. Stack structure 111 may include interleaved conductive layers 113 and dielectric layers 107, and the stacked conductive/dielectric layer pairs are also referred to as a memory stack. In some implementations, dielectric layers 107 may include dielectric materials including, but not limited to, silicon oxide, silicon nitride, silicon oxynitride, or any combination thereof. In some implementations, conductive layers 113 may form the word lines and may include conductive materials including, but not limited to, tungsten (W), cobalt (Co), copper (Cu), aluminum (Al), polysilicon, doped silicon, silicides, or any combination thereof.

Channel structure 118 may extend through stack structure 111, and the bottom of channel structure 118 may contact a source of 3D memory device 100. In some implementations, channel structure 118 may include a semiconductor channel 132 and a memory film 125 formed over semiconductor channel 132. The meaning of "over" here, besides the explanation stated above, should also be interpreted "over" something from the top side or from the lateral side. In some implementations, channel structure 118 may also include a dielectric core 129 in the center of channel structure 118. In some implementations, memory film 125 may include a tunneling layer 130 over semiconductor channel 132, a storage layer 128 over tunneling layer 130, and a blocking layer 126 over storage layer 128.

Dielectric core 129, semiconductor channel 132, tunneling layer 130, storage layer 128, and blocking layer 126 are arranged radially from the center toward the outer surface of channel structure 118 in this order, according to some implementations. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

As shown in FIG. 1, a dummy channel structure 124 may be formed in stack structure 111 extending along the z-direction. In some implementations, a contact structure 134 may be formed in stack structure 111 extending along the z-direction. It is understood that, in the actual structure, stack structure 111 and the staircase region (including dummy channel structure 124 and/or contact structure 134) may not be seen in the same cross-section. For the purpose of better describing the present disclosure, the cross-sections of stack structure 111 and the staircase region are illustrated in the same drawings in the present disclosure, and the coordinates of x-direction and y-direction are noted in FIG. 1 to show the perpendicularity of the cross-sections of stack structure 111 and the staircase region.

In some implementations, a peripheral device may be formed above or beneath 3D memory device 100, and the conductive paths formed by contact structures 134 may be used to connect the peripheral device. For example, the source terminals of 3D memory device 100 may be connected to the peripheral device through the conductive paths formed by one or multiple contact structures 134, and therefore the peripheral device may control the operations of 3D memory device 100. In some implementations, the conductive paths formed by contact structures 134 may be used to connected other devices disposed above, below, or aside 3D memory device 100. In some implementations, the peripheral device may include one or more peripheral circuits. In some implementations, the peripheral circuits may be electrically connected to 3D memory device 100 through the conductive wires, such as the redistribution layers.

Figure 2:
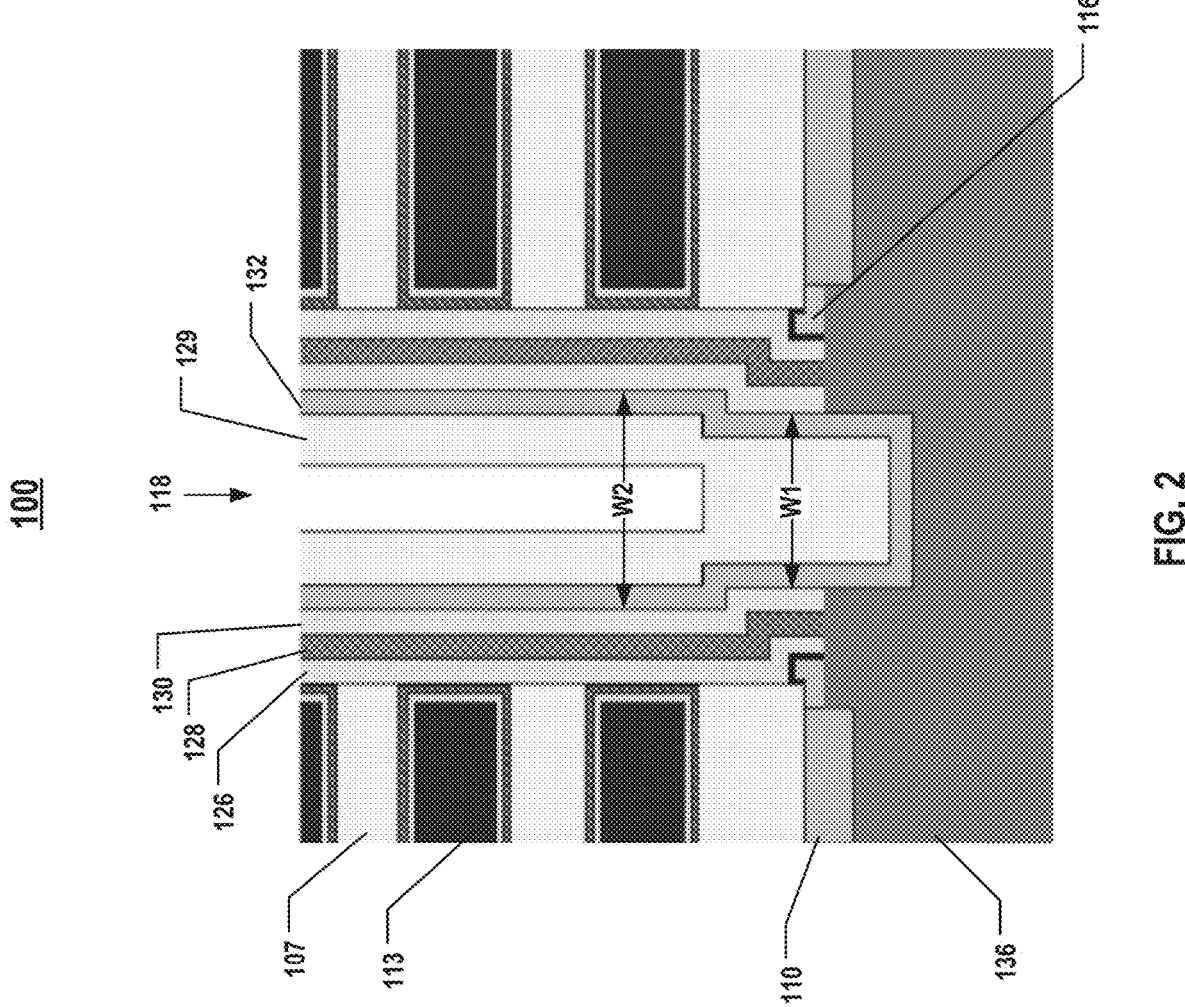
FIG. 2 illustrates a cross-section of a bottom portion of a channel structure, according to some aspects of the present disclosure.

FIG. 2 illustrates a cross-section of a bottom portion of channel structure 118 of 3D memory device 100, according to some aspects of the present disclosure. As shown in FIG. 2, the bottom portion of channel structure 118 may include a bending structure of semiconductor channel 132, tunneling layer 130, and storage layer 128. A semiconductor layer, e.g., a polysilicon layer 136, may be disposed under stack structure 111, as shown in FIG. 1 and FIG. 2. In some implementations, polysilicon layer 136 is in direct contact with semiconductor channel 132. In some implementations, polysilicon layer 136 is in direct contact with the bottom surface of semiconductor channel 132 and a portion of a side surface of semiconductor channel 132 at the bottom portion of channel structure 118. In some implementations, the bottom surface of memory film 125, including blocking layer 126, storage layer 128, and tunneling layer 130, is above the bottom surface of semiconductor channel 132, as shown in FIG. 2.

In some implementations, channel structure 118 is a circular structure in a plan view of 3D memory device 100. In some implementations, dielectric core 129, semiconductor channel 132, tunneling layer 130, storage layer 128, and blocking layer 126 are arranged radially from the center toward the outer surface of channel structure 118. As shown in FIG. 2, semiconductor channel 132 at the bottom portion of channel structure 118 may have a different diameter compared to semiconductor channel 132 at the upper portion of channel structure 118. In some implementations, in the plan view of 3D memory device 100, semiconductor channel 132 at the bottom portion of channel structure 118 may have an outer diameter, or an outer width, $W1$, semiconductor channel 132 at the upper portion of channel structure 118 may have an outer diameter, or an outer width, $W2$, and $W1$ is smaller than $W2$. Here, the upper portion of channel structure 118 refers to channel structure 118 above the bending structure, and the bottom portion of channel structure 118 refers to channel structure 118 under the bending structure, as shown in FIG. 2.

In some implementations, the bending structure of channel structure 118 may be formed as an angled structure in the cross-section of channel structure 118. For example, as shown in FIG. 2, semiconductor channel 132 may be formed as two right-angle structures. In some implementations, semiconductor channel 132 may be formed as obtuse angle structures, acute angle structures, right angle structures, arc angle structures, or any combination of these angled structures. The outer diameter $W1$ of semiconductor channel 132 at the bottom portion of channel structure 118 below the angled structure is smaller than the outer diameter $W2$ of semiconductor channel 132 at the upper portion of channel structure 118 above the angled structure.

In some implementations, a semiconductor layer, e.g., a polysilicon layer 110, may be formed between polysilicon layer 136 and stack structure 111. In some implementations, a dielectric layer 116 may be formed between polysilicon layer 110 and channel structure 118. In other words, dielectric layer 116 insulates channel structure 118 and polysilicon layer 110. It is noted that, in some implementations, dielectric layer 116 and blocking layer 126 may be formed by the same material, e.g., silicon oxide, and in the cross-sectional view of 3D memory device 100, polysilicon layer 110 may be in contact with channel structure 118 through dielectric layer 116.

FIGS. 3-16 illustrate cross-sections of 3D memory device 100 at different stages of a manufacturing process, according to some aspects of the present disclosure. FIG. 17 illustrates a flowchart of an exemplary method 1700 for forming 3D memory device 100, according to some aspects of the present disclosure. For the purpose of better describing the present disclosure, the cross-sections of 3D memory device 100 in FIGS. 3-16 and method 1700 in FIG. 17 will be discussed together. It is understood that the operations shown in method 1700 are not exhaustive and that other operations may be performed as well before, after, or between any of the illustrated operations. Further, some of the operations may be performed simultaneously, or in a different order than shown in FIGS. 3-16 and FIG. 17.

Figure 3:
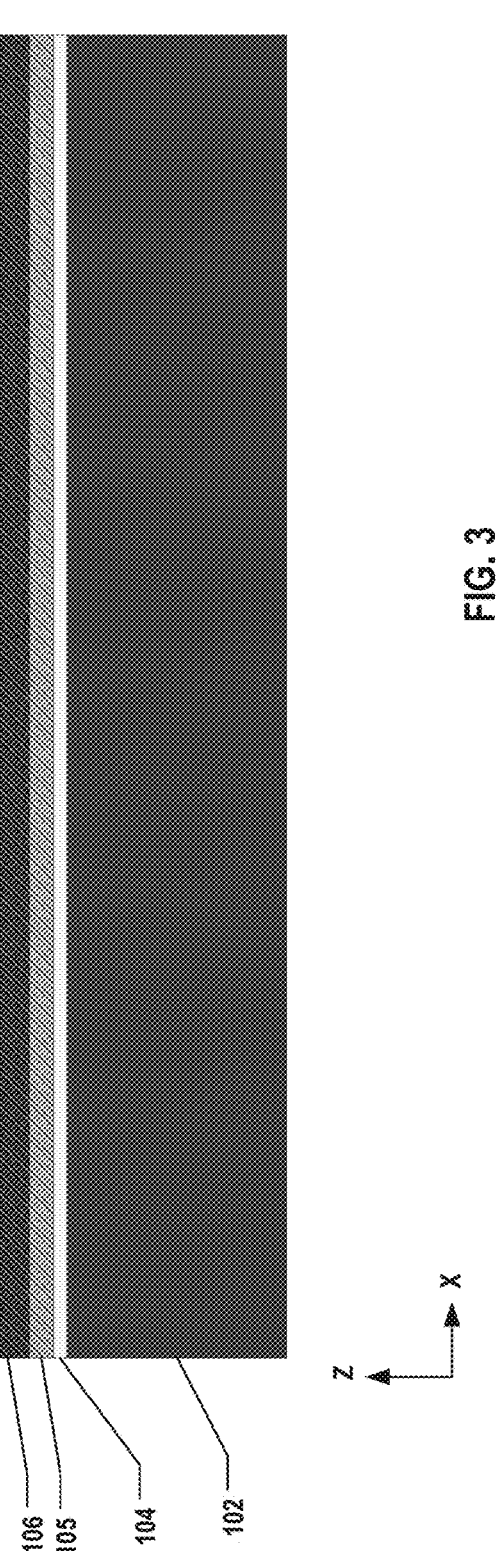
FIGS. 3-16 illustrate cross-sections of an exemplary 3D memory device at different stages of a manufacturing process, according to some aspects of the present disclosure.

As shown in FIG. 3 and operation 1702 in FIG. 17, a dielectric layer 104, e.g., a first dielectric layer, a polysilicon layer 105, e.g., a first polysilicon layer, and a polysilicon layer 106, e.g., a second polysilicon layer, are formed on a substrate 102. In some implementations, substrate 102 may be a doped or undoped semiconductor layer. In some implementations, dielectric layer 104 may be a silicon oxide layer. In some implementations, polysilicon layer 105 may be a carbon doping (c-doping) or undoped polysilicon layer. In some implementations, polysilicon layer 106 may be a p-type doping (p-doping) polysilicon layer. In some implementations, dielectric layer 104, polysilicon layer 105, and polysilicon layer 106 may be sequentially deposited by one or more thin film deposition processes including, but not limited to, chemical vapor deposition (CVD), physical vapor deposition (PVD), atomic layer deposition (ALD), or any combination thereof.

In some implementations, polysilicon layer 106 may have an oxidation rate higher than the oxidation rate of polysilicon layer 105. In some implementations, after the formation of polysilicon layer 106, an ammonia ($NH_3$) treatment may be performed on polysilicon layer 106. In some implementations, the $NH_3$ treatment may be performed on top surfaces of polysilicon layer 106. In some implementations, the $NH_3$ treatment on top surfaces of polysilicon layer 106 may prevent an oxide layer formed along top surfaces of polysilicon layer 106 in a later oxidation process.

Figure 4:
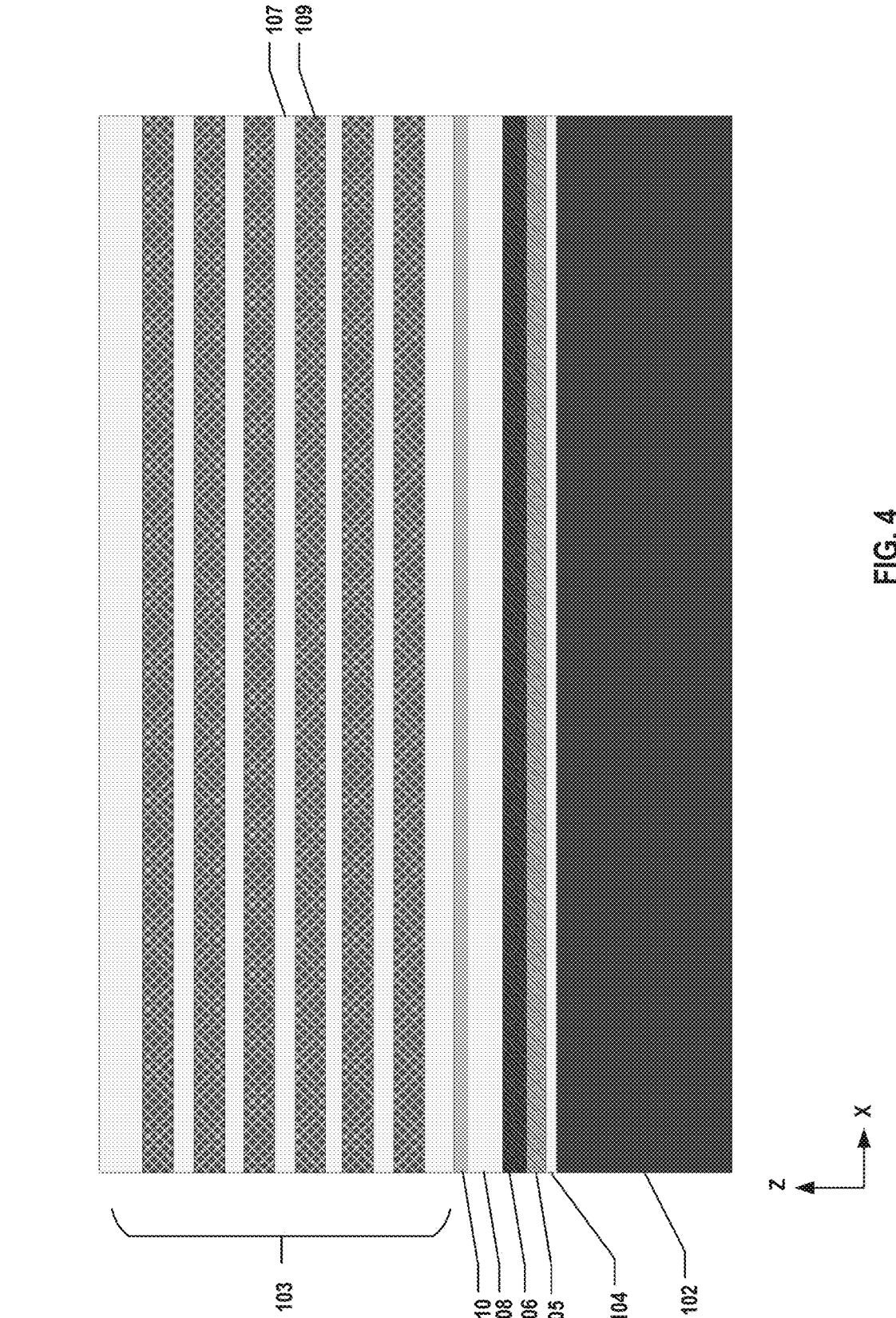

As shown in FIG. 4 and operation 1704 in FIG. 17, a dielectric layer 108, e.g., a second dielectric layer, and a polysilicon layer 110, e.g., a third polysilicon layer, may be formed on polysilicon layer 106. In some implementations, dielectric layer 108 may be a silicon oxide layer. In some implementations, polysilicon layer 110 may be an undoped polysilicon layer. In some implementations, dielectric layer 108 and polysilicon layer 110 may be sequentially deposited by one or more thin film deposition processes including, but not limited to, CVD, PVD, ALD, or any combination thereof.

In some implementations, polysilicon layer 106 may have an oxidation rate higher than the oxidation rate of polysilicon layer 110. In some implementations, after the formation of polysilicon layer 110, an $NH_3$ treatment may be performed on polysilicon layer 110. In some implementations, the $NH_3$ treatment may be performed on top surfaces of polysilicon layer 110. In some implementations, the $NH_3$ treatment on top surfaces of polysilicon layer 106 may prevent an oxide layer formed along top surfaces of polysilicon layer 110 in a later oxidation process. In some implementations, polysilicon layer 110 may be formed without performing the $NH_3$ treatment.

As shown in FIG. 4 and operation 1706 in FIG. 17, a dielectric stack 103 including interleaved dielectric layers 107, e.g., third dielectric layers, and dielectric layers 109, e.g., fourth dielectric layers, may be formed on polysilicon layer 110. In some implementations, dielectric layers 109 may be sacrificial layers and will be removed in a later operation. In some implementations, each dielectric layer 107 may include a layer of silicon oxide, and each dielectric layer 109 may include a layer of silicon nitride. In some implementations, dielectric stack 103 may be formed by one or more thin film deposition processes including, but not limited to, CVD, PVD, ALD, or any combination thereof.

Figure 5:
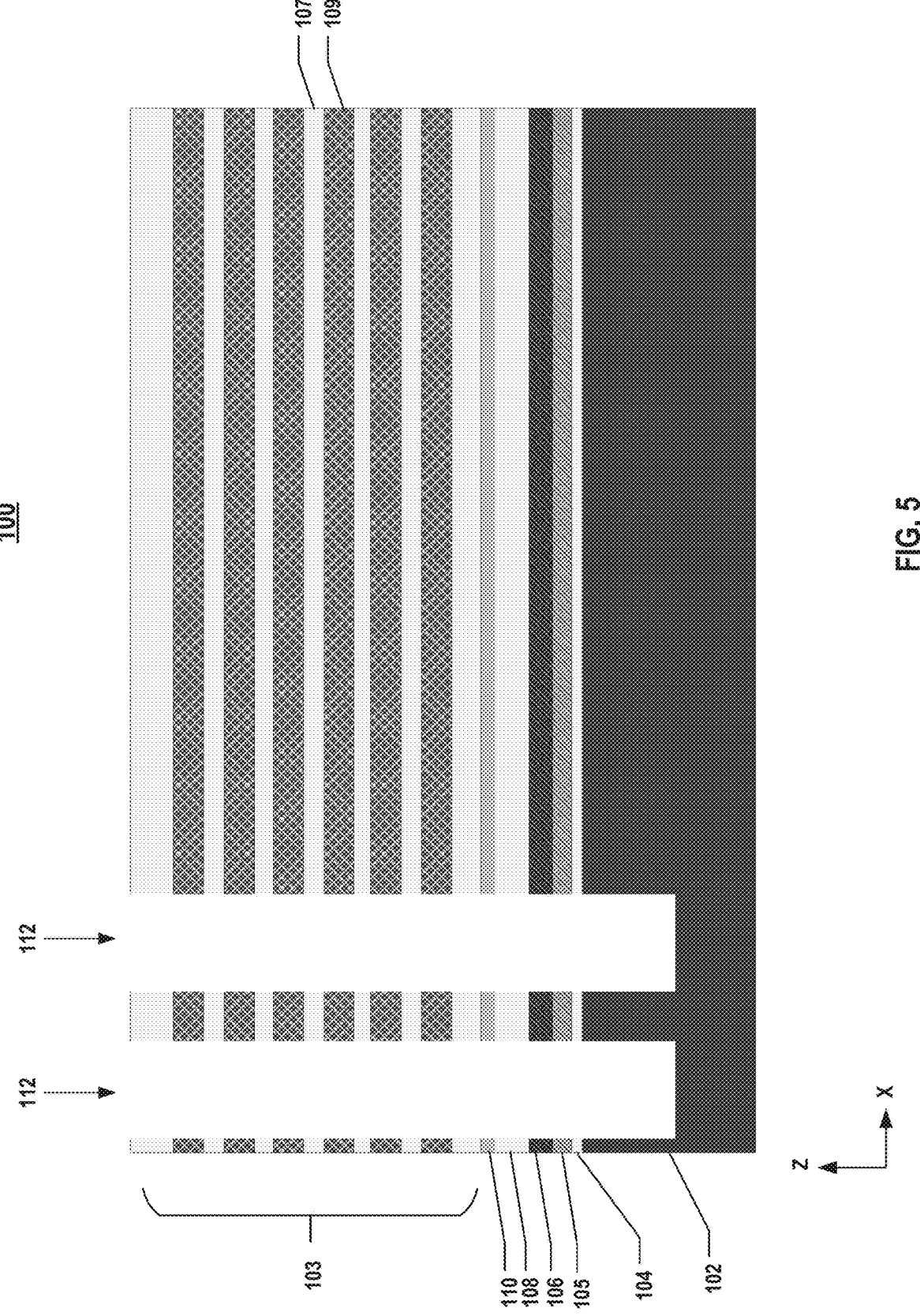

As shown in FIG. 5 and operation 1708 in FIG. 17, one or more than one channel hole 112 may be formed penetrating through dielectric stack 103, polysilicon layer 110, dielectric layer 108, polysilicon layer 106, polysilicon layer 105, and dielectric layer 104 to expose substrate 102. In some implementations, channel hole 112 may be formed vertically. In some implementations, channel hole 112 may be formed extending along the z-direction. As shown in FIG. 5, polysilicon layer 110, polysilicon layer 106, and polysilicon layer 105 are exposed by the sidewalls of channel hole 112. In some implementations, fabrication processes for forming channel hole 112 may include wet etching and/or dry etching, such as deep reactive ion etching (DRIE).

Figure 6:
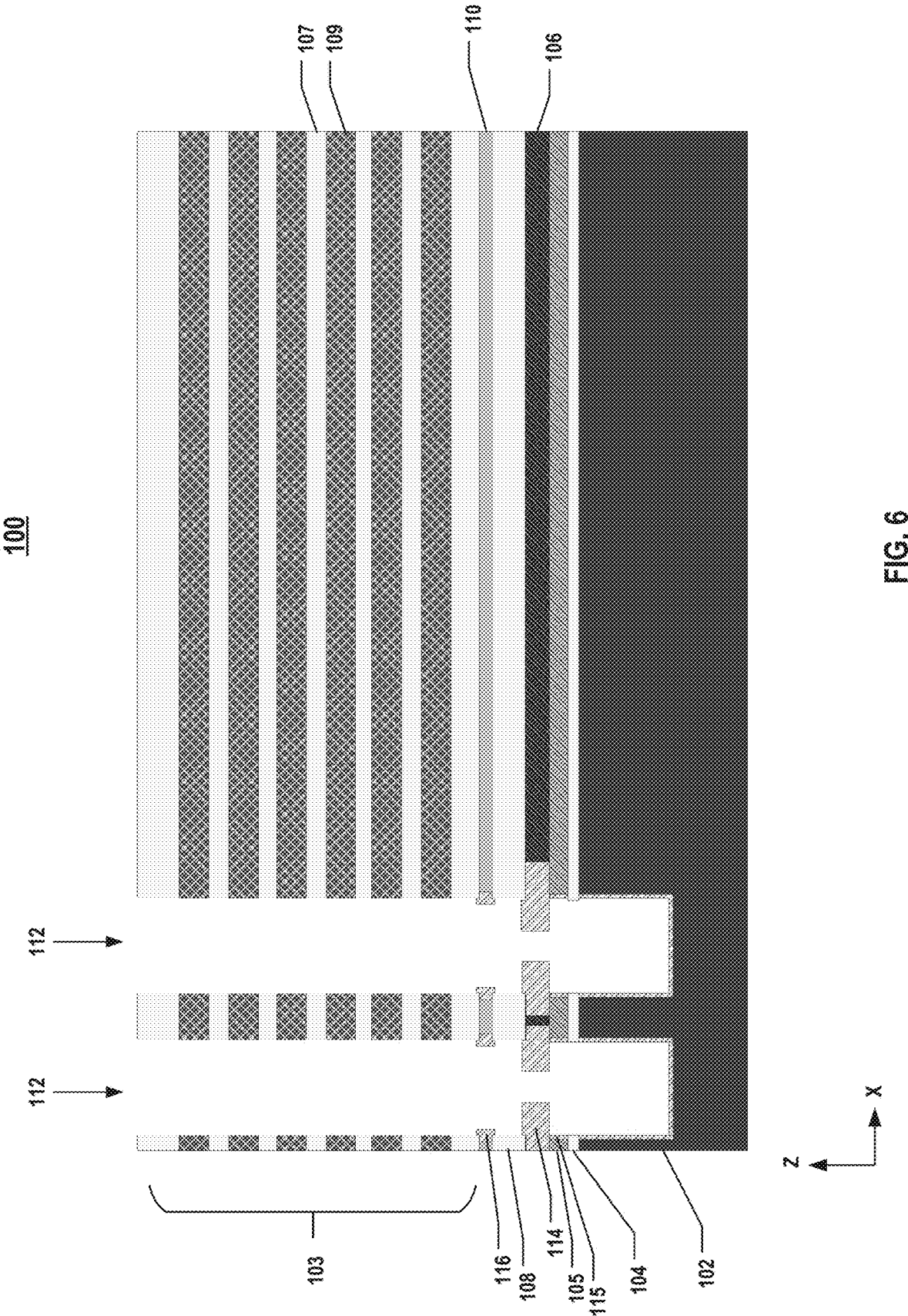

As shown in FIG. 6 and operation 1710 in FIG. 17, an oxidation operation is performed to form, a dielectric layer 114, e.g., a fifth dielectric layer, on polysilicon layer 106 and a dielectric layer 115 on polysilicon layer 105 exposed by sidewalls of channel hole 112. In some implementations, a dielectric layer 116 is also formed on polysilicon layer 110 exposed by sidewalls of channel hole 112. Because polysilicon layer 106 is a p-doping polysilicon layer, polysilicon layer 105 is a c-doping or undoped polysilicon layer, and polysilicon layer 110 is an undoped polysilicon layer, the oxidation rate of polysilicon layer 105, polysilicon layer 106, and polysilicon layer 110 may be different. In some implementations, the oxidation rate of polysilicon layer 106 exposed by sidewalls of channel hole 112 is higher than the oxidation rate of polysilicon layer 105 and polysilicon layer 110 exposed by sidewalls of channel hole 112.

In some implementations, because the $NH_3$ treatment is performed on top surfaces of polysilicon layer 106 and polysilicon layer 110 during the formation of polysilicon layer 106 and polysilicon layer 110, dielectric layer 114 and dielectric layer 116 may be formed on sidewalls of channel hole 112 along the x-direction and y-direction which is a plane perpendicular to the z-direction.

In the plan view of 3D memory device 100, channel hole 112 may be a circle, and the exposed sidewall is the circumference of the circle. In some implementations, the formation of dielectric layer 114, dielectric layer 115, and dielectric layer 116 begins from the circumference of the circle and then extends to the center of the circle.

In some implementations, based on the formation speed of dielectric layer 114, fourth dielectric layer 114 formed on one side of polysilicon layer 106 in channel hole 112 may be in contact with dielectric layer 114 formed on the other side of polysilicon layer 106. In some implementations, dielectric layer 114 formed on one side of polysilicon layer 106 in channel hole 112 may be separated with dielectric layer 114 formed on the other side of polysilicon layer 106 by a gap. It is understood that the one side or the other side of channel hole 112 described here are the viewpoints from the cross-sectional view. In the actual structure, from a plan view, channel hole 112 may be a hole, and dielectric layer 114 formed on polysilicon layer 106 may be formed from the circumference to the center. In some implementations, in the plan view, dielectric layer 114 formed on polysilicon layer 106 may cover the whole channel hole 112. In some implementations, in the plan view, dielectric layer 114 formed on polysilicon layer 106 may have a gap (a hole) at the center of channel hole 112. In some implementations, the width of the gap may be controlled during the formation operation, and the size of the gap may further cause various structures of the memory film to be formed in a later process. In some implementations, the width of the gap may be controlled to cause parts of the memory film or the whole memory film being filled in the gap. For example, the memory film including the tunneling layer, the storage layer, and the blocking layer may be formed, filling the gap. For another example, the blocking layer may be formed, filling the gap.

In some implementations, dielectric layer 116 may be formed on polysilicon layer 110 exposed by sidewalls of channel hole 112. Because polysilicon layer 106 includes doped polysilicon, and polysilicon layer 110 includes undoped polysilicon, the formation speed of dielectric layer 114 may be higher than dielectric layer 116. Hence, the area of dielectric layer 114 may be larger than the area of dielectric layer 116. It is understood that in the cross-sectional view of FIG. 6, dielectric layer 116 is formed from two sides of polysilicon layer 110; however, in the plan view of the structure, dielectric layer 116 is formed on polysilicon layer 110 from the circumference to the center.

Figure 7:
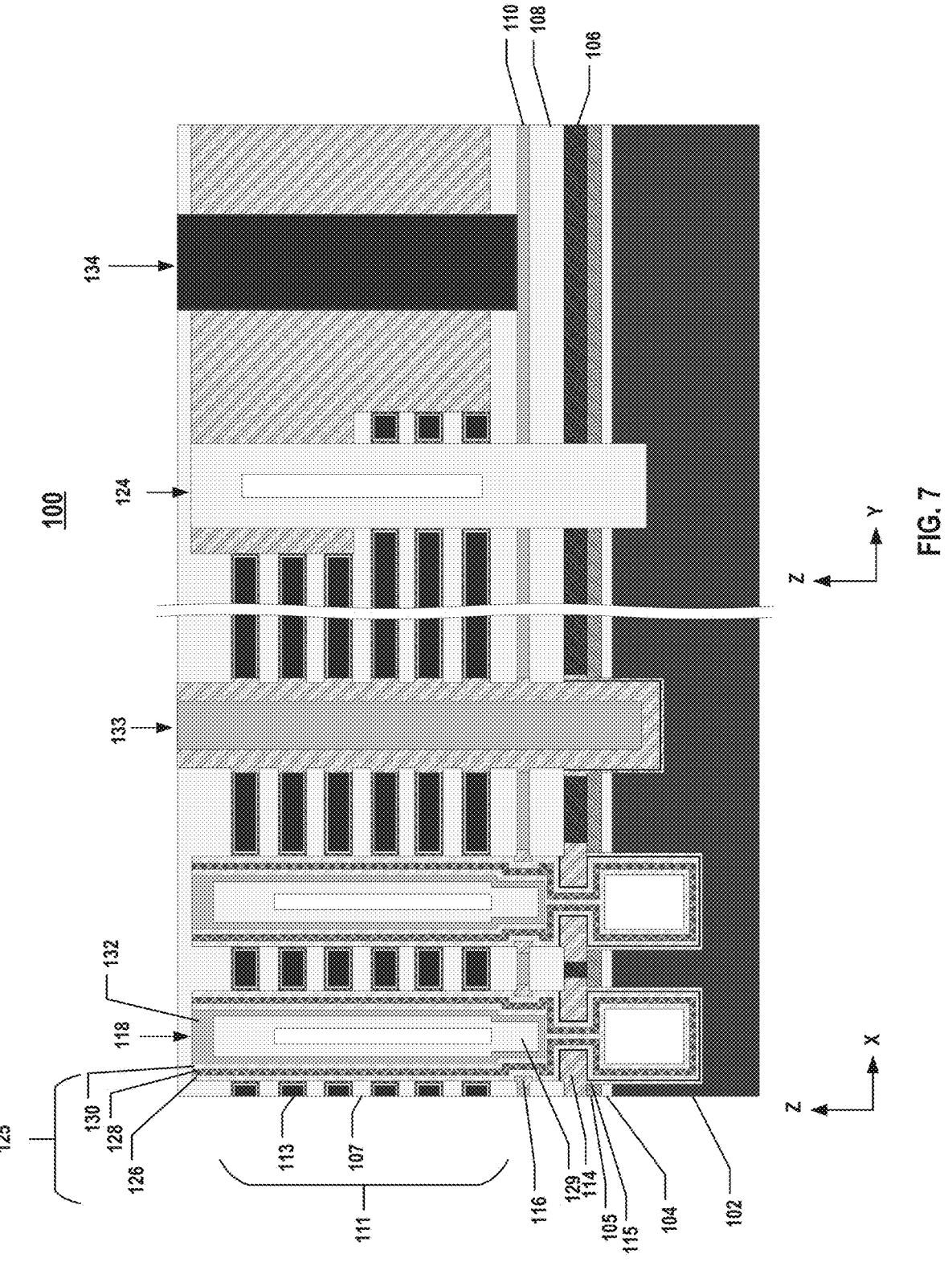

As shown in FIG. 7 and operation 1712 in FIG. 17, channel structure 118 may be formed in channel hole 112. Channel structure 118 may include memory film 125 and semiconductor channel 132. In some implementations, channel structure 118 may also include dielectric core 129 in the center of channel structure 118. In some implementations, memory film 125 is a composite layer including tunneling layer 130, storage layer 128 (also known as a "charge trap layer"), and blocking layer 126. Channel structure 118 can have a cylinder shape (e.g., a pillar shape), and the bottom portion of the cylinder shape may be shrunk at the portion having dielectric layer 116 formed on sidewalls of channel hole 112. In some implementations, channel structure 118 may be a cone shape, and the bottom portion of the cone shape is smaller than the upper portion of the cone shape. In this situation, the bottom portion of the cone shape may be shrunk at the portion having dielectric layer 116 formed on sidewalls of channel hole 112.

In some implementations, when dielectric layer 114 formed on polysilicon layer 106 has a gap (a hole) at the center of channel hole 112, memory film 125 including tunneling layer 130, storage layer 128, and blocking layer 126 may be formed, filling the gap. In some implementations, memory film 125 may fully fill the gap, as shown in FIG. 7. Hence, by controlling the size of the gap or the hole formed by dielectric layer 114 through the oxidation operation, the portion of channel structure 118 that is above dielectric layer 114 is formed by memory film 125 and semiconductor channel 132. The portion of channel structure 118 that is under dielectric layer 114 is formed only by memory film 125 including tunneling layer 130, storage layer 128, and blocking layer 126 (the ONO layers).

Dielectric core 129, semiconductor channel 132, tunneling layer 130, storage layer 128, and blocking layer 126 are arranged radially from the center toward the outer surface of the pillar in this order, according to some implementations. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, memory film 125 may include a composite layer of silicon oxide/silicon oxynitride (or silicon nitride)/silicon oxide (ONO).

A gate line slit opening may be further formed along the z-direction penetrating through dielectric stack 103, polysilicon layer 110, dielectric layer 108, polysilicon layer 106, polysilicon layer 105, and dielectric layer 104 to expose substrate 102. The gate line slit opening may be formed by performing dry etch, wet etch, or other suitable processes. In some implementations, the gate line slit opening may extend to substrate 102.

Then, a word line replacement operation may be performed, and dielectric layers 109 may be removed and replaced by word lines, e.g., conductive layers 113 in FIG. 1. For example, dielectric layers 109 may be removed by dry etch, wet etch, or other suitable processes to form a plurality of cavities. Conductive layers 113 may be formed in the cavities by sequentially deposing the gate dielectric layer made from high-k dielectric materials, the adhesion layer including titanium/titanium nitride (Ti/TiN) or tantalum/tantalum nitride (Ta/TaN), and the gate conductor made from tungsten. After the word line replacement operation, stack structure 111 is formed, as shown in FIG. 7.

In some implementations, a removal process may be performed to clean the gate line slit opening. The removal process may remove the residues of former procedures from the gate line slit opening. For example, the high-k dielectric materials may be removed from the gate line slit opening. Then, in some implementations, a gate line slit 133 may be formed in the gate line slit opening. In some implementations, gate line slit 133 may include a dielectric layer. In some implementations, gate line slit 133 may further include one or more conductive layers, such as polysilicon, tungsten (W), or the combination of polysilicon and W.

In some implementations, dummy channel structure 124 may be formed in stack structure 111 extending along the z-direction. In some implementations, contact structure 134 may be formed in stack structure 111 extending along the z-direction. In some implementations, contact structure 134 may be in contact with polysilicon layer 110. In some implementations, gate line slit 133 may be formed before the word line replacement operation. In some implementations, after forming gate line slit 133, dummy channel structure 124, and contact structure 134 on substrate 102, one or more interconnection layers may be further formed on the memory array. In addition, a peripheral circuit may be formed on another substrate and be bonded with the memory array in a later process.

As shown in FIGS. 8-12 and operation 1714 in FIG. 17, a substrate removal operation is performed. In some implementations, substrate 102, polysilicon layer 105, polysilicon layer 106, dielectric layer 108, and a bottom portion of channel structure 118 are sequentially removed.

Figure 8:
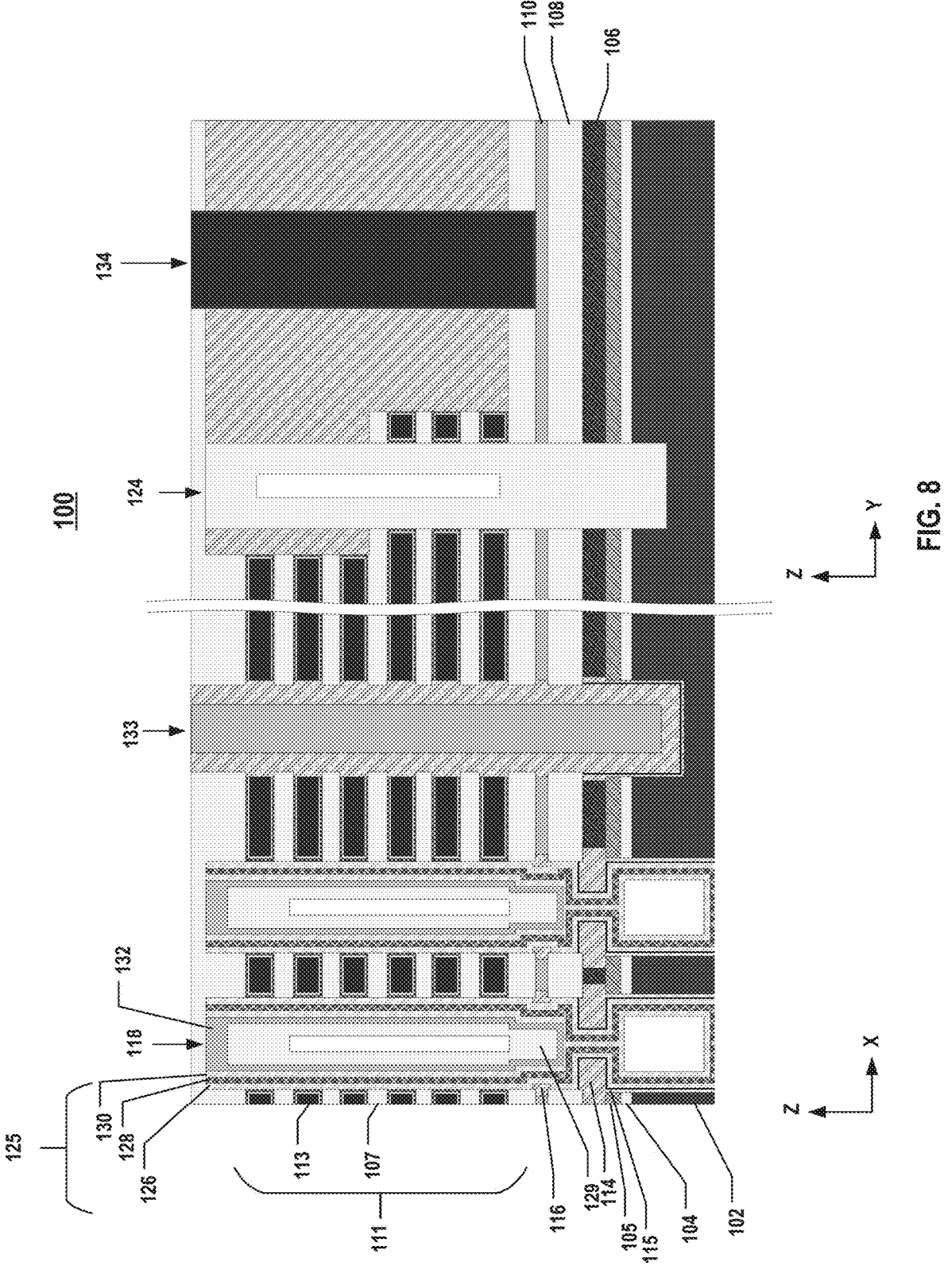

As shown in FIG. 8, substrate 102 may be removed by the chemical mechanical polishing (CMP) processes, and the CMP process may be stopped at the bottom portion of channel structure 118. In some implementations, the bottom portion of channel structure 118 may be exposed after the CMP process. In some implementations, substrate 102 may be peeled off. In some implementations, in which substrate 102 includes silicon, substrate 102 may be removed using silicon CMP, which can be automatically stopped when reaching the stop layer having materials other than silicon, i.e., the bottom portion of channel structure 118.

Figure 9:
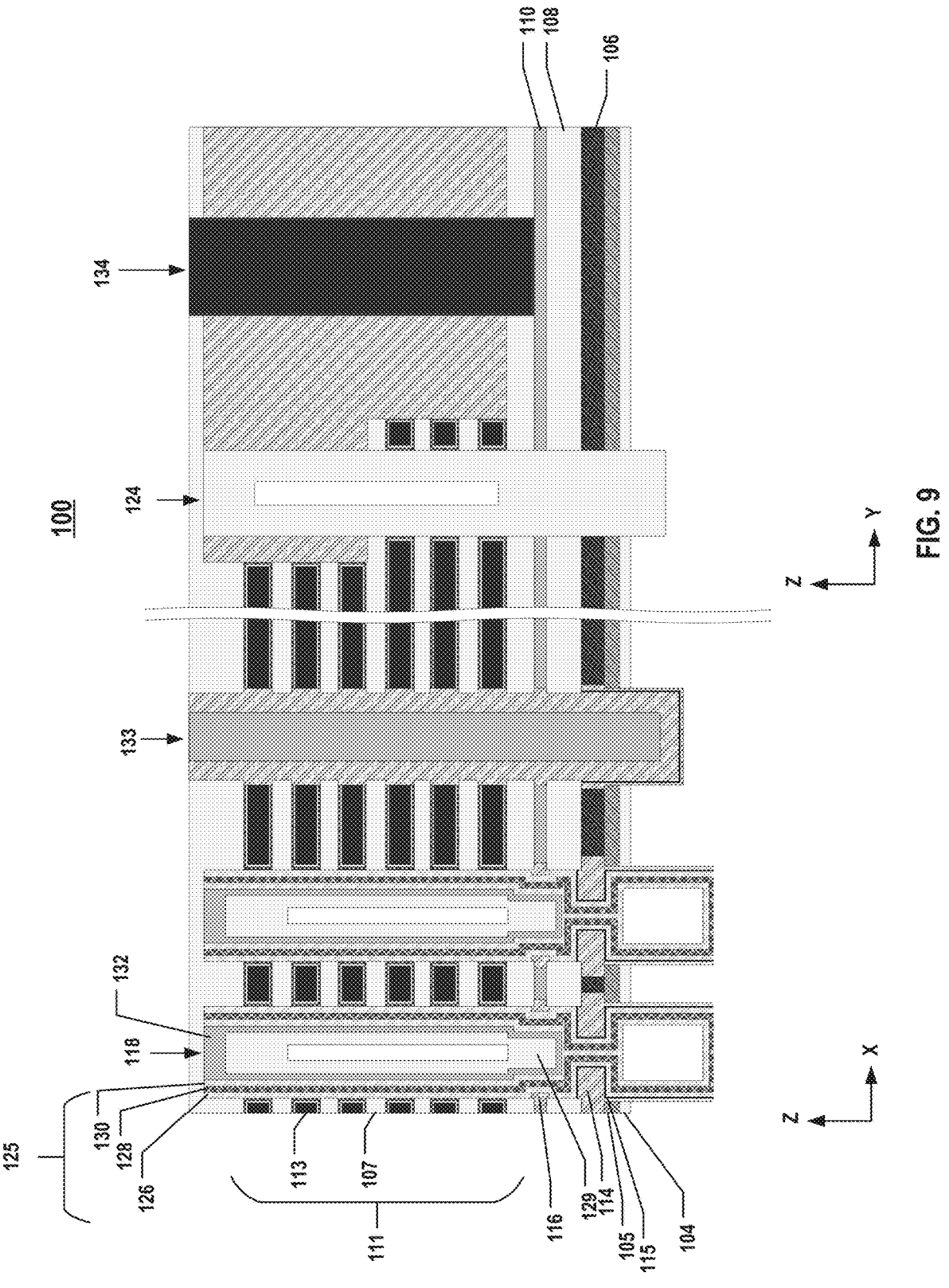

As shown in FIG. 9, in some implementations, substrate 102 may be further removed by the wet etch, dry etching, or other suitable processes until being stopped by dielectric layer 104. When using wet etch to remove substrate 102, the bottom portion of channel structure 118, the bottom portion of gate line slit 133, and the bottom portion of dummy channel structure 124 may be remained. In some implementations, substrate 102 is removed using wet etching by tetramethylammonium hydroxide (TMAH), which is automatically stopped when reaching the stop layer having materials other than silicon, i.e., dielectric layer 104. In some implementations, substrate 102 may be removed by the CMP processes, and the bottom portion of channel structure 118, the bottom portion of gate line slit 133, and the bottom portion of dummy channel structure 124 may be removed together.

Figure 10:
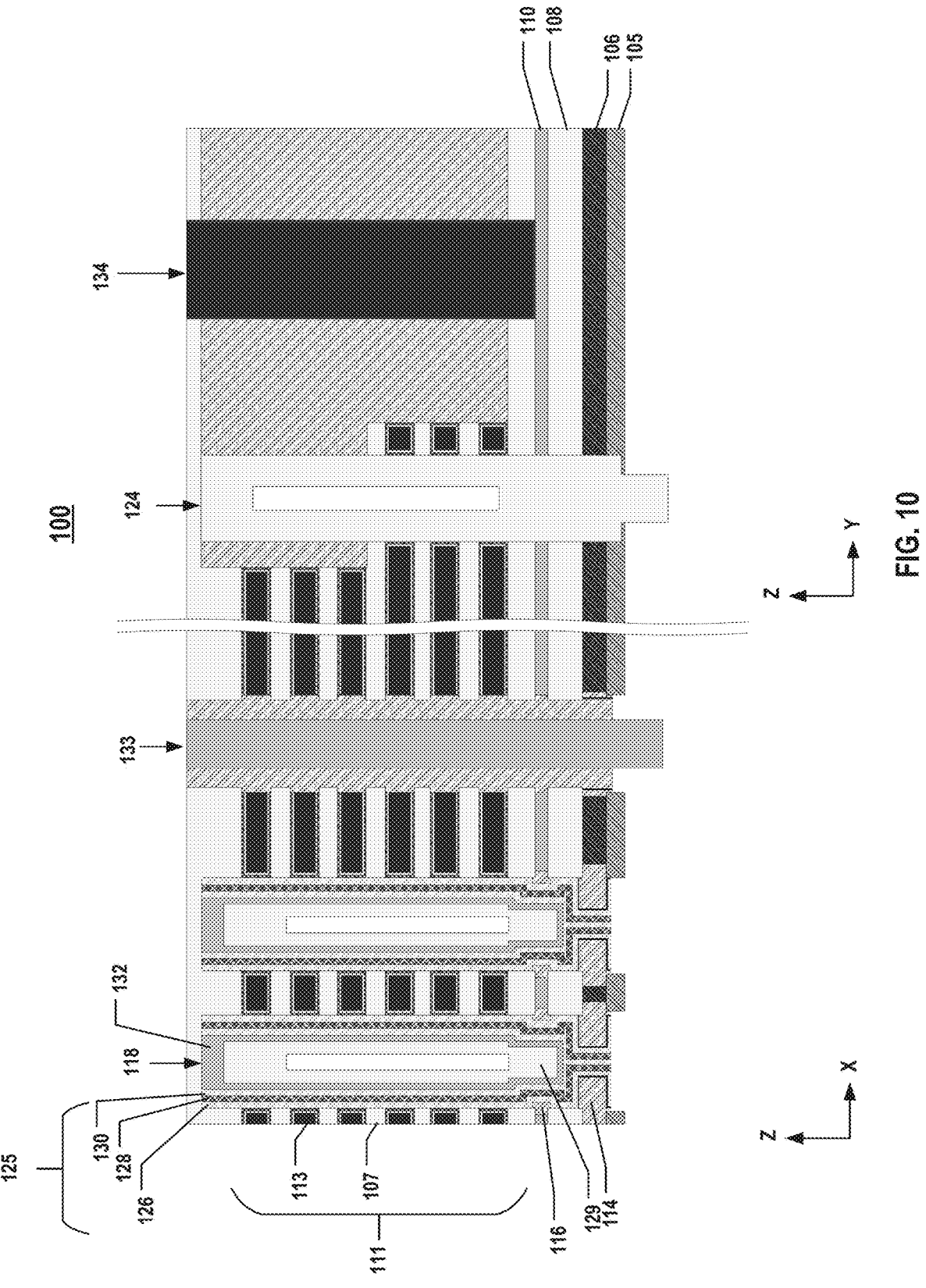

As shown in FIG. 10, dielectric layer 104, partials of the bottom portion of channel structure 118, partials of the bottom portion of gate line slit 133, and partials of the bottom portion of dummy channel structure 124 may be then removed. In some implementations, dielectric layer 104, partials of the bottom portion of channel structure 118, partials of the bottom portion of gate line slit 133, and partials of the bottom portion of dummy channel structure 124 may be removed by wet etch, dry etch, CMP, or other suitable processes.

Because the portion of channel structure 118 under dielectric layer 114 is formed only by memory film 125 including tunneling layer 130, storage layer 128, and blocking layer 126 (the ONO layers), when removing dielectric layer 104, memory film 125 under dielectric layer 114 may be completely removed as well. Hence, by using the polysilicon oxidation operation performed on polysilicon layer 106, the depth of channel structure 118 can be controlled in a predefined range, and the depth or the bottom profile of channel structure 118 will not be affected by the residues formed in channel hole 112. The control of channel profile is therefore improved.

Figure 11:
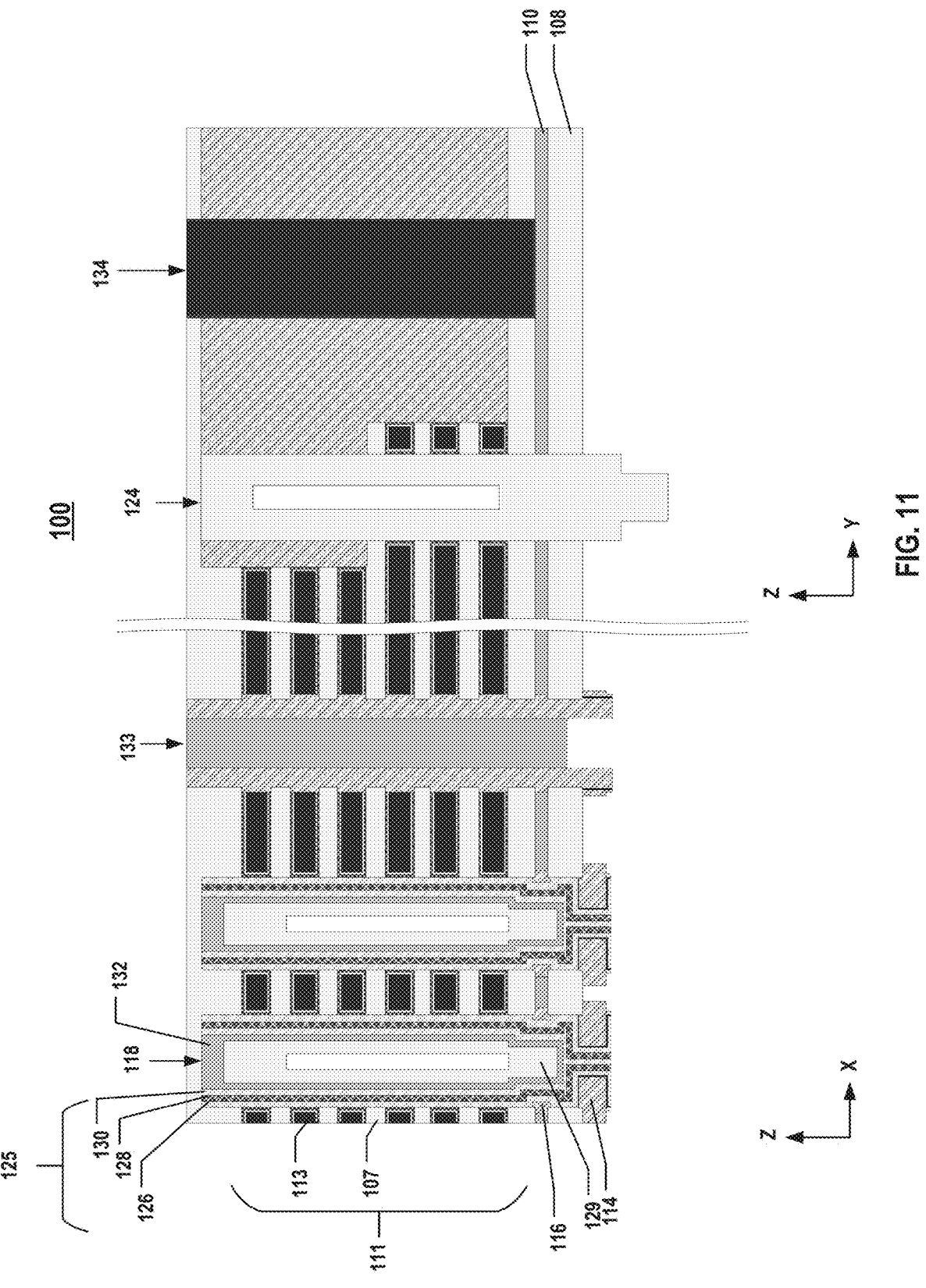

Then, as shown in FIG. 11, polysilicon layer 105 and polysilicon layer 106 are removed. In some implementations, polysilicon layer 105 and polysilicon layer 106 may be removed by wet etch, dry etch, CMP, or other suitable processes.

Figure 12:
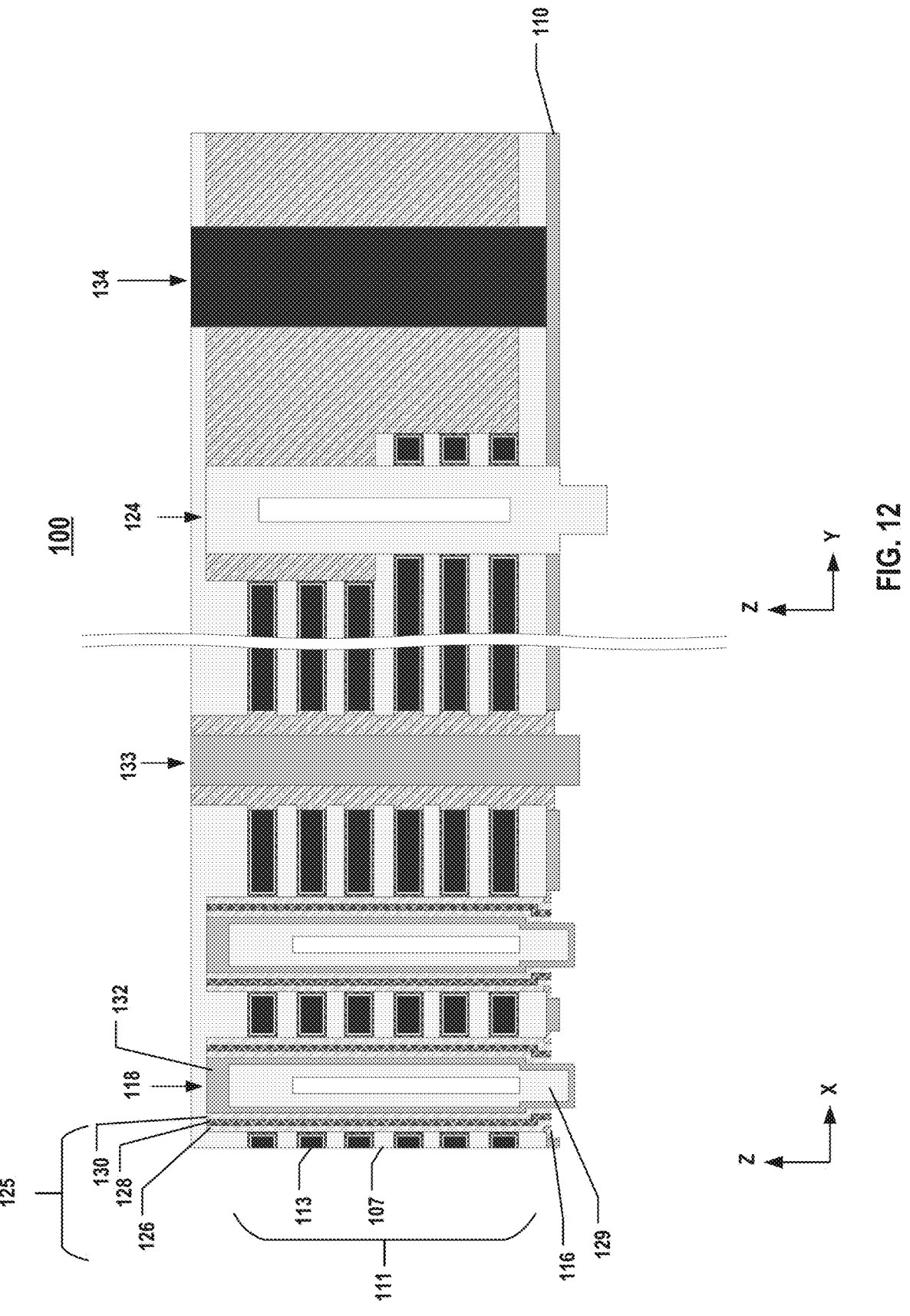

As shown in FIG. 12, dielectric layer 108 and dielectric layer 114 are removed to expose polysilicon layer 110, and a portion of the memory film is removed to expose portions of tunneling layer 130, storage layer 128, and blocking layer 126. In some implementations, dielectric layer 108, dielectric layer 114, and the portion of the memory film may be removed by one etch process. In some implementations, dielectric layer 108, dielectric layer 114, and the portion of the memory film may be removed by multiple etch processes. For example, dielectric layer 108 and dielectric layer 114 may be removed first. Storage layer 128 including silicon nitride is selectively removed using wet etching with suitable etchants, such as phosphoric acid, without etching polysilicon layer 110. The etching of storage layer 128 may be controlled by controlling the etching time and/or etching rate, such that the etching does not continue to affect the rest of storage layer 128 surrounded by the memory stack. Then, blocking layer 126 and tunneling layer 130 including silicon oxide may be selectively removed using wet etching with suitable etchants, such as hydrofluoric acid, without etching polysilicon layer 110 and semiconductor channel 132 including polysilicon. The etching of blocking layer 126 and tunneling layer 130 may be controlled by controlling the etching time and/or etching rate, such that the etching does not continue to affect the rest of blocking layer 126 and tunneling layer 130 surrounded by the memory stack. In some implementations, after removing the portion of the memory film, the bottom surfaces of the exposed portions of tunneling layer 130, storage layer 128, and blocking layer 126 are above the bottom surface of semiconductor channel 132.

Because during the formation of channel structure 118, dielectric layer 116 forms a protrusion on sidewalls of channel hole 112 along the x-direction and/or y-direction, the bottom portion of the cylinder shape of channel structure 118 is affected by dielectric layer 116 and forms a shrunk structure, or a depression, as shown in FIG. 12. After the bottom portion of the memory film is removed, in some implementations, the exposed portions of tunneling layer 130 and storage layer 128 may have a critical dimension (or a diameter from the plan view) smaller than tunneling layer 130 and storage layer 128 located at the upper portion of channel structure 118, as shown in FIG. 12. Furthermore, in some implementations, the exposed portion of semiconductor channel 132 at the bottom portion of channel structure 118 has a critical dimension (or a diameter from the plan view) smaller than semiconductor channel 132 located at the upper portion of channel structure 118 as well.

In another implementations, dielectric layer 108 may be removed by CMP process, and the bottom surface of gate line slit 133 and the bottom surface of dummy channel structure 124 may be coplanar to or substantially coplanar to the bottom surface of polysilicon layer 110.

Figure 13:
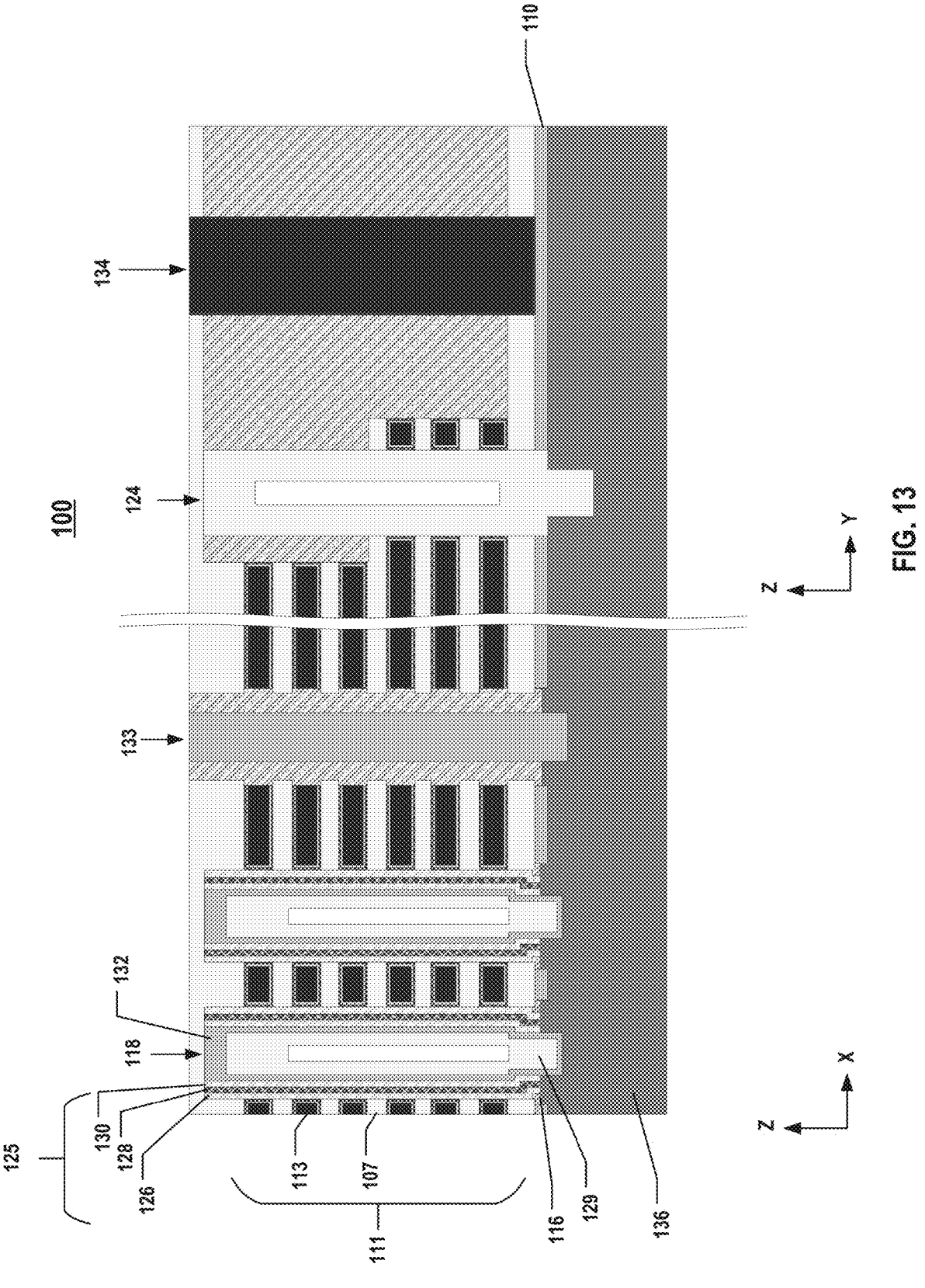

As shown in FIG. 13 and operation 1716 in FIG. 17, a polysilicon layer 136, e.g., a fourth polysilicon layer, may be formed over the exposed channel structure 118 and polysilicon layer 110. In some implementations, polysilicon layer 136 may be formed by CVD, PVD, ALD, or other suitable processes.

Figure 14:
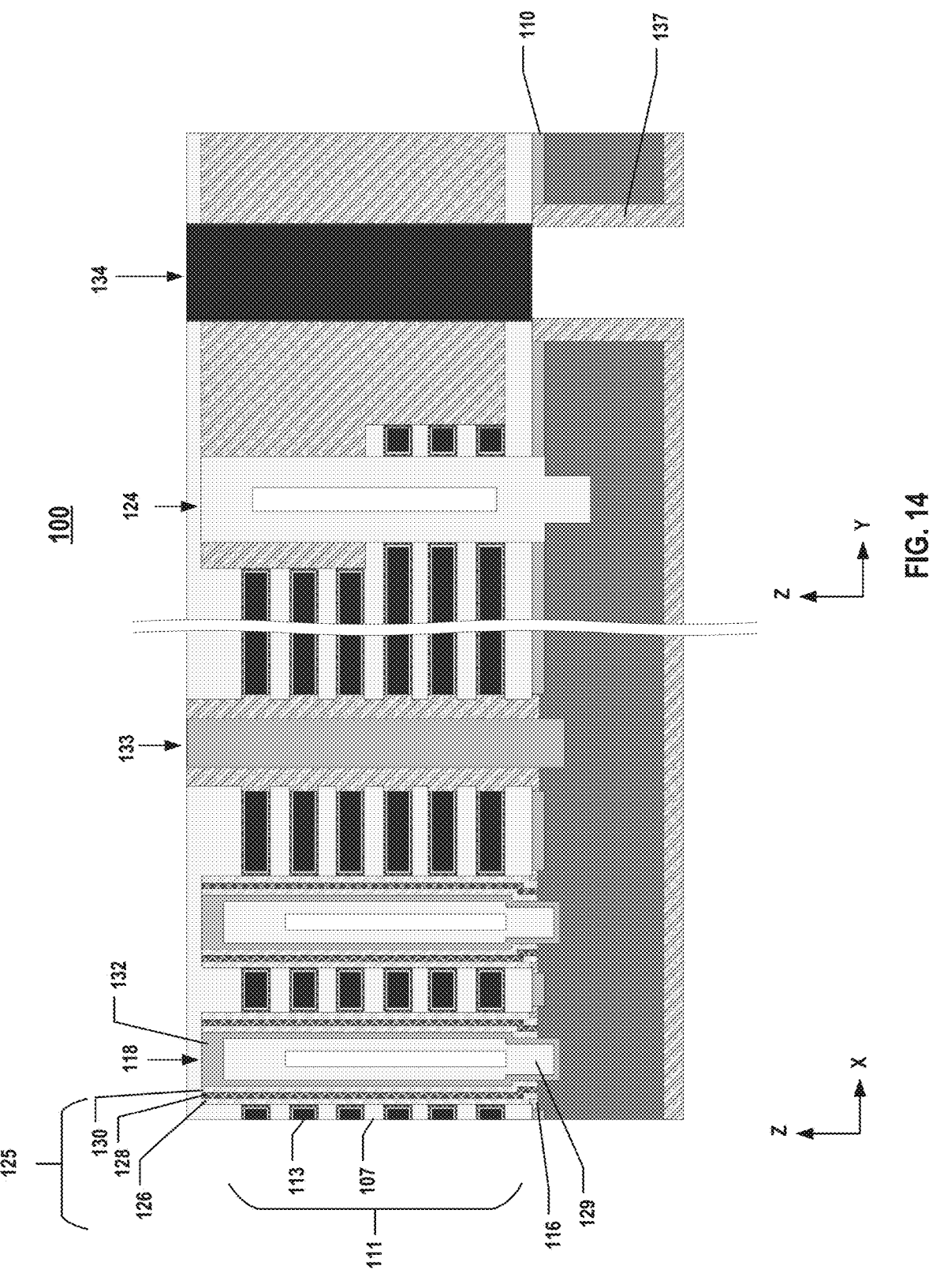
Figure 15:
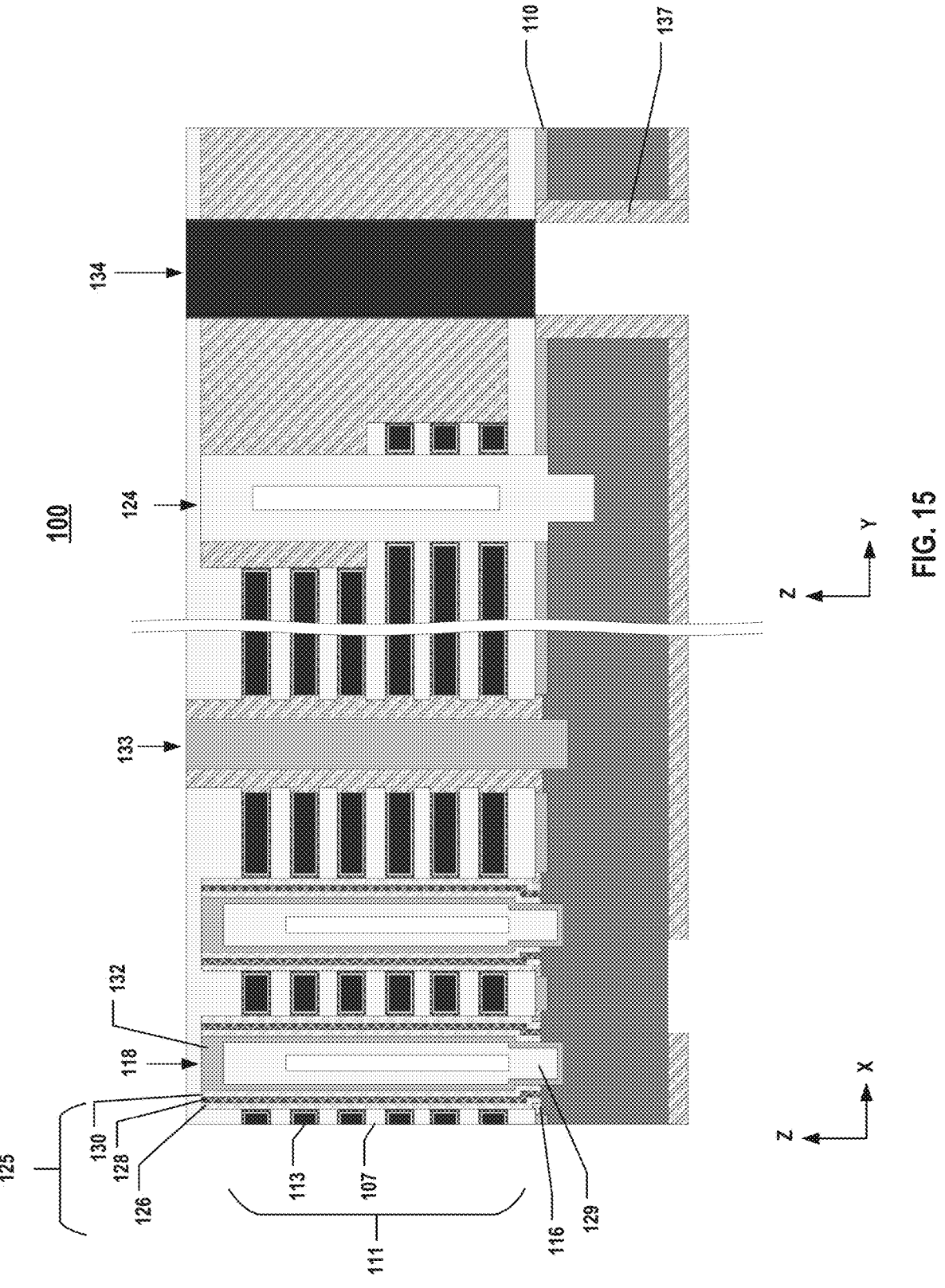
Figure 16:
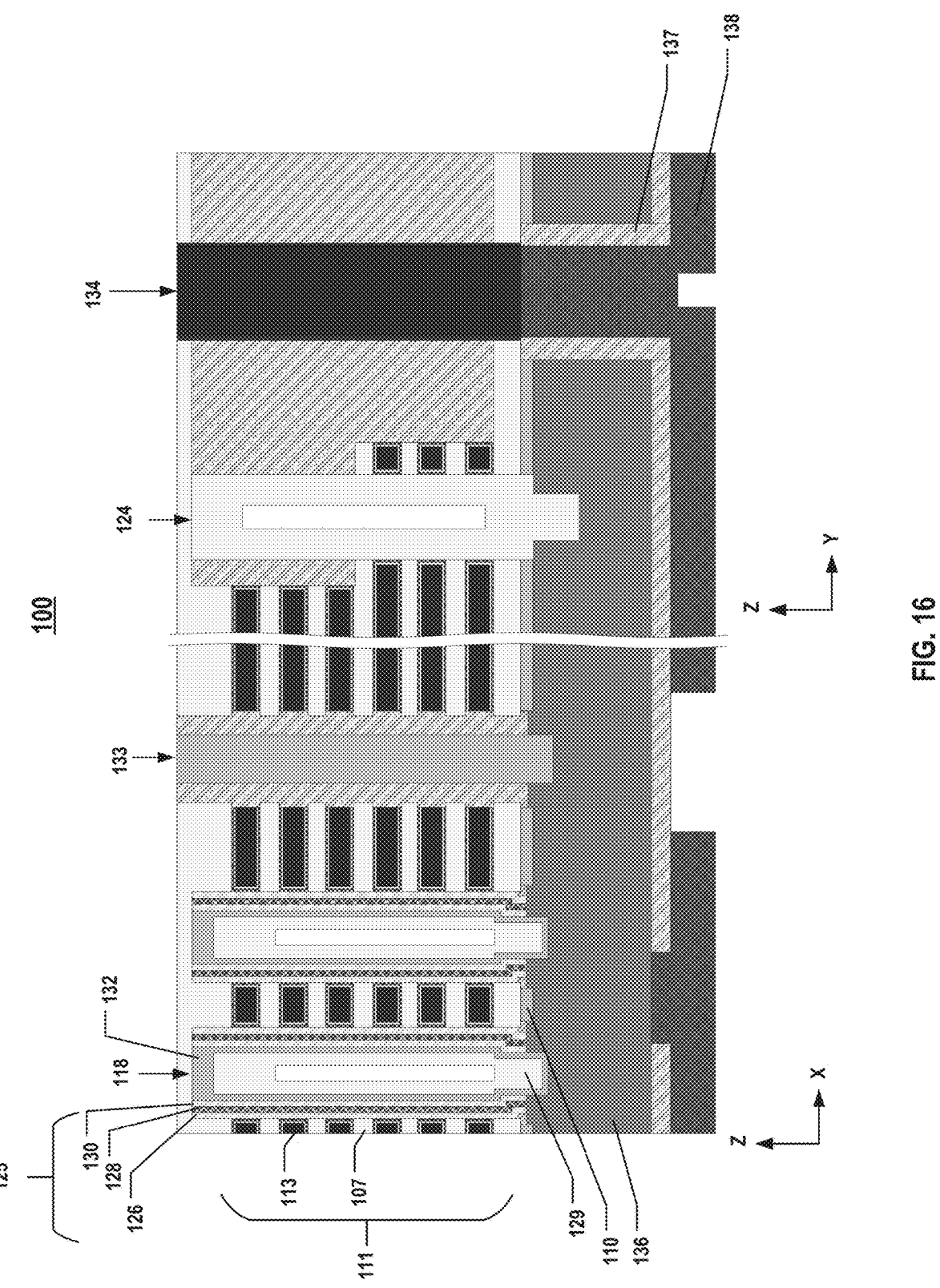

As shown in FIG. 14, a through silicon contact (TSC) is formed to expose the contact structure, and a spacer layer 137, e.g., a silicon oxide layer, may be formed covering the sidewalls of the TSC. As shown in FIG. 15, a contact hole is formed on spacer layer 137. Then, as shown in FIG. 16, a contact pad 138 is formed in contact with contact structure 134 or in contact with polysilicon layer 136.

By forming dielectric layer 114 on polysilicon layer 106 exposed by sidewalls of channel hole 112, channel hole 112 may be fully or partially filled by dielectric layer 114. Hence, the bottom portion of channel structure 118 may be defined by the position of dielectric layer 114 and polysilicon layer 106. The bottom portion of channel structure 118 will not be affected by channel hole etch gouging, and therefore the process window of the formation of channel holes will be greatly increased.

FIG. 18 illustrates a flowchart of another exemplary method 1700 for forming 3D memory device 100, according to some aspects of the present disclosure. For the purpose of better describing the present disclosure, the cross-sections of 3D memory device 100 in FIGS. 3-16 and method 1800 in FIG. 18 will be discussed together. It is understood that the operations shown in method 1800 are not exhaustive and that other operations may be performed as well before, after, or between any of the illustrated operations. Further, some of the operations may be performed simultaneously, or in a different order than shown in FIGS. 3-16 and FIG. 18.

As shown in FIGS. 3-4 and operation 1802 in FIG. 18, a stack structure including at least a polysilicon layer, e.g., polysilicon layer 106, and dielectric stack 103 may be formed on substrate 102. In some implementations, substrate 102 may be a doped or undoped semiconductor layer. In some implementations, polysilicon layer 106 may be a p-doping polysilicon layer. In some implementations, polysilicon layer 106 may be sequentially deposited by one or more thin film deposition processes including, but not limited to, CVD, PVD, ALD, or any combination thereof. In some implementations, after the formation of polysilicon layer 106, an ammonia ($NH_3$) treatment may be performed on polysilicon layer 106. In some implementations, the $NH_3$ treatment may be performed on top surfaces of polysilicon layer 106. In some implementations, the $NH_3$ treatment on top surfaces of polysilicon layer 106 may prevent an oxide layer formed along top surfaces of polysilicon layer 106 in a later oxidation process.

In some implementations, dielectric stack 103 including interleaved dielectric layers 107 and dielectric layers 109, may be formed on polysilicon layer 106. In some implementations, dielectric layers 109 may be sacrificial layers and will be removed in a later operation. In some implementations, each dielectric layer 107 may include a layer of silicon oxide, and each dielectric layer 109 may include a layer of silicon nitride. In some implementations, dielectric stack 103 may be formed by one or more thin film deposition processes including, but not limited to, CVD, PVD, ALD, or any combination thereof.

As shown in FIG. 5 and operation 1804 in FIG. 18, one or more than one channel hole 112 may be formed penetrating the stack structure. In some implementations, channel hole 112 may be formed vertically. In some implementations, channel hole 112 may be formed extending along the z-direction. As shown in FIG. 5, polysilicon layer 110, polysilicon layer 106, and polysilicon layer 105 are exposed by the sidewalls of channel hole 112. In some implementations, fabrication processes for forming channel hole 112 may include wet etching and/or dry etching, such as DRIE.

As shown in FIG. 6 and operation 1806 in FIG. 18, an oxidation operation may be performed on sidewalls of channel hole 112 to form dielectric layer 114 on polysilicon layer 106 exposed the channel hole 112. In some implementations, a first width of channel hole 112 at a location of dielectric stack 103 is larger than a second width of channel hole 112 at a location of dielectric layer 114.

In some implementations, based on the formation speed of dielectric layer 114, fourth dielectric layer 114 formed on one side of polysilicon layer 106 in channel hole 112 may be in contact with dielectric layer 114 formed on the other side of polysilicon layer 106. In some implementations, dielectric layer 114 formed on one side of polysilicon layer 106 in channel hole 112 may be separated with dielectric layer 114 formed on the other side of polysilicon layer 106 by a gap. It is understood that the one side or the other side of channel hole 112 described here are the viewpoints from the cross-sectional view. In the actual structure, from a plan view, channel hole 112 may be a hole, and dielectric layer 114 formed on polysilicon layer 106 may be formed from the circumference to the center. In some implementations, in the plan view, dielectric layer 114 formed on polysilicon layer 106 may cover the whole channel hole 112. In some implementations, in the plan view, dielectric layer 114 formed on polysilicon layer 106 may have a gap (a hole) at the center of channel hole 112. In some implementations, the width of the gap may be controlled during the formation operation, and the size of the gap may further cause various structures of the memory film to be formed in a later process. In some implementations, the width of the gap may be controlled to cause parts of the memory film or the whole memory film to be filled in the gap. For example, the memory film including the tunneling layer, the storage layer, and the blocking layer may be formed, filling the gap. For another example, the blocking layer may be formed, filling the gap.

As shown in FIG. 7 and operation 1808 in FIG. 18, channel structure 118 may be formed in channel hole 112. Channel structure 118 may include memory film 125 and semiconductor channel 132. In some implementations, when dielectric layer 114 formed on polysilicon layer 106 has a gap (a hole) at the center of channel hole 112, memory film 125 including tunneling layer 130, storage layer 128, and blocking layer 126 may be formed, filling the gap. In some implementations, memory film 125 may fully fill the gap, as shown in FIG. 7. Hence, by controlling the size of the gap or the hole formed by dielectric layer 114 through the oxidation operation, the portion of channel structure 118 above dielectric layer 114 is formed by memory film 125 and semiconductor channel 132. The portion of channel structure 118 under dielectric layer 114 is formed only by memory film 125 including tunneling layer 130, storage layer 128, and blocking layer 126 (the ONO layers). Then, a word line replacement operation may be performed, and dielectric layers 109 may be removed and replaced by word lines, e.g., conductive layers 113 in FIG. 1.

As shown in FIGS. 8-12 and operation 1810 in FIG. 18, a substrate removal operation is performed. In some implementations, substrate 102, polysilicon layer 106, and a bottom portion of channel structure 118 may be removed.

Because the portion of channel structure 118 under dielectric layer 114 is formed only by memory film 125 including tunneling layer 130, storage layer 128, and blocking layer 126 (the ONO layers), when removing substrate 102, polysilicon layer 106, and a bottom portion of channel structure 118, memory film 125 under dielectric layer 114 may be completely removed as well. Hence, by using the polysilicon oxidation operation performed on polysilicon layer 106, the depth of channel structure 118 can be controlled in a predefined range, and the depth or the bottom profile of channel structure 118 will not be affected by the residues formed in channel hole 112. The control of channel profile is therefore improved.

Then, as shown in FIG. 11, polysilicon layer 106 is removed. In some implementations, polysilicon layer 106 may be removed by wet etch, dry etch, CMP, or other suitable processes.

As shown in FIG. 13 and operation 1812 in FIG. 18, a semiconductor layer, e.g., polysilicon layer 136, may be formed over exposed channel structure 118. In some implementations, polysilicon layer 136 may be formed by CVD, PVD, ALD, or other suitable processes.

By forming dielectric layer 114 on polysilicon layer 106 exposed by sidewalls of channel hole 112, channel hole 112 may be fully or partially filled by dielectric layer 114. Hence, the bottom portion of channel structure 118 may be defined by the position of dielectric layer 114 and polysilicon layer 106. The bottom portion of channel structure 118 will not be affected by channel hole etch gouging, and therefore the process window of the formation of channel holes will be greatly increased.

FIG. 19 illustrates a block diagram of an exemplary system 1900 having a memory device, according to some aspects of the present disclosure. System 1900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 19, system 1900 can include a host 1908 and a memory system 1902 having one or more memory devices 1904 and a memory controller 1906. Host 1908 can be a processor of an electronic device, such as a central processing unit (CPU), or a system-on-chip (SoC), such as an application processor (AP). Host 1908 can be configured to send or receive data to or from memory devices 1904.

Memory device 1904 can be any memory device disclosed in the present disclosure. As disclosed above in detail, memory device 1904, such as a NAND Flash memory device, may have a controlled and predefined discharge current in the discharge operation of discharging the bit lines. Memory controller 1906 is coupled to memory device 1904 and host 1908 and is configured to control memory device 1904, according to some implementations. Memory controller 1906 can manage the data stored in memory device 1904 and communicate with host 1908. For example, memory controller 1906 may be coupled to memory device 1904, such as 3D memory device 100 described above, and memory controller 1906 may be configured to control the operations of channel structure 118 through the peripheral device. By forming the dielectric layer on the polysilicon layer exposed by sidewalls of the channel holes, the bottom portion of channel structures will not be affected by channel hole etch gouging, and therefore the process window of forming 3D memory device 100 will be greatly increased.

In some implementations, memory controller 1906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1906 can be configured to control operations of memory device 1904, such as read, erase, and program operations. Memory controller 1906 can also be configured to manage various functions with respect to the data stored or to be stored in memory device 1904 including, but not limited to bad-block management, garbage collection, logical-to-physical address conversion, wear leveling, etc. In some implementations, memory controller 1906 is further configured to process error correction codes (ECCs) with respect to the data read from or written to memory device 1904. Any other suitable functions may be performed by memory controller 1906 as well, for example, formatting memory device 1904. Memory controller 1906 can communicate with an external device (e.g., host 1908) according to a particular communication protocol. For example, memory controller 1906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1906 and one or more memory devices 1904 can be integrated into various types of storage devices, for example, be included in the same package, such as a universal Flash storage (UFS) package or an eMMC package. That is, memory system 1902 can be implemented and packaged into different types of end electronic products. In one example as shown in FIG. 20A, memory controller 1906 and a single memory device 1904 may be integrated into a memory card 2002. Memory card 2002 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 2002 can further include a memory card connector 2004 coupling memory card 2002 with a host (e.g., host 1908 in FIG. 19). In another example as shown in FIG. 20B, memory controller 1906 and multiple memory devices 1904 may be integrated into an SSD 2006. SSD 2006 can further include an SSD connector 2008 coupling SSD 2006 with a host (e.g., host 1908 in FIG. 19). In some implementations, the storage capacity and/or the operation speed of SSD 2006 is greater than those of memory card 2002.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
    forming a first dielectric layer, a first polysilicon layer, and a second polysilicon layer on a substrate;
    forming a second dielectric layer and a third polysilicon layer on the second polysilicon layer;
    forming a dielectric stack comprising interleaved third dielectric layers and fourth dielectric layers on the third polysilicon layer;
    forming a channel hole penetrating the dielectric stack, the third polysilicon layer, the second dielectric layer, the second polysilicon layer, the first polysilicon layer, and the first dielectric layer to expose the substrate;
    performing an oxidation operation to form a fifth dielectric layer on the first polysilicon layer and the second polysilicon layer exposed by sidewalls of the channel hole;
    forming a channel structure in the channel hole;
    removing the substrate, the first polysilicon layer, the second polysilicon layer, the second dielectric layer, and a bottom portion of the channel structure; and
    forming a fourth polysilicon layer over the channel structure.

2. The method of claim 1, wherein forming the first dielectric layer, the first polysilicon layer, and the second polysilicon layer on the substrate, comprises:
    forming the first dielectric layer on the substrate;
    forming an undoped polysilicon layer or a carbon-doping polysilicon layer on the first dielectric layer as the first polysilicon layer; and
    forming a p-type doping polysilicon layer on the undoped polysilicon layer or the carbon-doping polysilicon layer as the second polysilicon layer, wherein the first polysilicon layer and the second polysilicon layer are formed in a same deposition operation.

3. The method of claim 1, further comprising:

performing an ammonia ($NH_3$) treatment on the second polysilicon layer.

4. The method of claim 1, wherein forming the second dielectric layer and the third polysilicon layer on the second polysilicon layer, comprises:

forming the second dielectric layer on the second polysilicon layer; and forming an undoped polysilicon layer on the second dielectric layer.

5. The method of claim 1, further comprising:

performing an $NH_3$ treatment on the third polysilicon layer.

6. The method of claim 1, wherein performing the oxidation operation to form the fifth dielectric layer on the first polysilicon layer and the second polysilicon layer exposed by the sidewalls of the channel hole, comprises:

performing a wet oxidation operation on the sidewalls of the channel hole.

7. The method of claim 1, wherein performing the oxidation operation to form the fifth dielectric layer on the first polysilicon layer and the second polysilicon layer exposed by the sidewalls of the channel hole, comprises:

forming the fifth dielectric layer on the first polysilicon layer and the second polysilicon layer exposed by the sidewalls of the channel hole; and forming a sixth dielectric layer on the third polysilicon layer exposed by the sidewalls of the channel hole.

8. The method of claim 7, wherein a first oxidation rate of the oxidation operation on the first polysilicon layer is lower than a second oxidation rate of the oxidation operation on the second polysilicon layer.

9. The method of claim 7, wherein a third oxidation rate of the oxidation operation on the third polysilicon layer is lower than the second oxidation rate of the oxidation operation on the second polysilicon layer.

10. The method of claim 1, wherein, after performing the oxidation operation, the channel hole comprises a first width at a location of the dielectric stack and a second width at a location of the second polysilicon layer, and the first width is larger than the second width.

11. The method of claim 10, wherein the second width is less than 40 nanometers.

12. The method of claim 1, wherein forming the channel structure in the channel hole, comprises:

forming a memory film over the sidewalls of the channel hole; and forming a semiconductor channel over the memory film above the second polysilicon layer.

13. A method for forming a three-dimensional (3D) memory device, comprising:

forming a stack structure comprising at least a polysilicon layer and a dielectric stack on a substrate;

forming a channel hole penetrating the stack structure;

performing an oxidation operation on sidewalls of the channel hole to form a dielectric layer on the polysilicon layer exposed by the channel hole, wherein a first width of the channel hole at a location of the dielectric stack is larger than a second width of the channel hole at a location of the dielectric layer;

forming a channel structure in the channel hole;

removing the substrate, the polysilicon layer, and a bottom portion of the channel structure; and forming a semiconductor layer over the channel structure.

14. The method of claim 13, wherein forming the stack structure comprising at least the polysilicon layer and the dielectric stack on the substrate, comprises:

forming a p-doping polysilicon layer on the substrate; and performing an NH3 treatment on the p-doped polysilicon layer.

15. The method of claim 13, wherein performing the oxidation operation on sidewalls of the channel hole to form the dielectric layer on the polysilicon layer exposed by the channel hole, comprises:

performing a wet oxidation operation on sidewalls of the channel hole.

16. The method of claim 13, wherein forming the channel structure in the channel hole, comprises:

forming a memory film over the sidewalls of the channel hole; and forming a semiconductor channel over the memory film above the polysilicon layer.

17. The method of claim 14, wherein forming the stack structure comprising at least the polysilicon layer and the dielectric stack on the substrate, comprises:

forming a first dielectric layer on the substrate;

forming an undoped polysilicon layer or a carbon-doping polysilicon layer on the first dielectric layer as a first polysilicon layer; and forming the p-doping polysilicon layer on the undoped polysilicon layer or the carbon-doping polysilicon layer as a second polysilicon layer, wherein the first polysilicon layer and the second polysilicon layer are formed in a same deposition operation.

18. The method of claim 17, further comprising:

forming a second dielectric layer and a third polysilicon layer on the second polysilicon layer.

19. The method of claim 18, wherein forming the channel hole penetrating the stack structure, comprises:

forming the channel hole penetrating the dielectric stack, the third polysilicon layer, the second dielectric layer, the second polysilicon layer, the first polysilicon layer, and the first dielectric layer to expose the substrate.

20. The method of claim 18, wherein performing the oxidation operation on sidewalls of the channel hole to form the dielectric layer on the polysilicon layer exposed by the channel hole, comprises:

forming the dielectric layer on the first polysilicon layer and the second polysilicon layer exposed by the channel hole.

* * * * *